United States Patent
Hsu

(10) Patent No.: US 9,408,305 B2
(45) Date of Patent: Aug. 2, 2016

(54) STRAIN ISOLATION STRUCTURES FOR STRETCHABLE ELECTRONICS

(71) Applicant: MC10, Inc., Lexington, MA (US)

(72) Inventor: Yung-Yu Hsu, San Jose, CA (US)

(73) Assignee: MC10, Inc., Lexington, MA (US)

( * ) Notice: Subject to any disclaimer, the term of this patent is extended or adjusted under 35 U.S.C. 154(b) by 0 days.

(21) Appl. No.: 14/947,558

(22) Filed: Nov. 20, 2015

(65) Prior Publication Data

US 2016/0081192 A1    Mar. 17, 2016

Related U.S. Application Data

(63) Continuation of application No. 13/843,873, filed on Mar. 15, 2013, now Pat. No. 9,226,402.

(60) Provisional application No. 61/658,140, filed on Jun. 11, 2012, provisional application No. 61/768,939, filed on Feb. 25, 2013.

(51) Int. Cl.
*H05K 1/00* (2006.01)
*H05K 1/11* (2006.01)
(Continued)

(52) U.S. Cl.
CPC ............... *H05K 1/118* (2013.01); *H05K 1/028* (2013.01); *H05K 1/0393* (2013.01); *H05K 1/185* (2013.01); *H05K 1/189* (2013.01); *H05K 1/0271* (2013.01); *H05K 1/036* (2013.01); *H05K 3/4694* (2013.01);
(Continued)

(58) Field of Classification Search
CPC ............ H05K 2201/1028; H05K 2201/10287; H05K 1/0393; H05K 1/189; H05K 1/118
USPC ......... 361/748, 749, 750, 751, 760, 761, 762, 361/764, 765, 776, 783; 174/521, 251, 254, 174/255, 256
See application file for complete search history.

(56) References Cited

U.S. PATENT DOCUMENTS 3,716,861 A    2/1973    Root
3,805,427 A    4/1974    Epstein
(Continued)

FOREIGN PATENT DOCUMENTS

EP    0585670 A2    3/1994
EP    2259062 A2    12/2010
(Continued)

OTHER PUBLICATIONS

Carvalhal et al., "Electrochemical Detection in a Paper-Based Separation Device", Analytical Chemistry, vol. 82, No. 3, (1162-1165) (4 pages) (Jan. 7, 2010).
(Continued)

*Primary Examiner* — Hoa C Nguyen
*Assistant Examiner* — Binh Tran
(74) *Attorney, Agent, or Firm* — Nixon Peabody LLP

(57) ABSTRACT

Buffer structures are provided that can be used to reduce a strain in a conformable electronic system that includes compliant components in electrical communication with more rigid device components. The buffer structures are disposed on, or at least partially embedded in, the conformable electronic system such that the buffer structures overlap with at least a portion of a junction region between a compliant component and a more rigid device component. The buffer structure can have a higher value of Young's modulus than an encapsulant of the conformable electronic system.

20 Claims, 13 Drawing Sheets

(51) Int. Cl.
*H05K 1/18* (2006.01)
*H05K 1/03* (2006.01)
*H05K 1/16* (2006.01)
*H01R 9/00* (2006.01)
*H05K 1/02* (2006.01)
*H05K 3/46* (2006.01)

(52) U.S. Cl.
CPC *H05K 2201/0133* (2013.01); *H05K 2201/0187* (2013.01); *H05K 2201/1028* (2013.01); *H05K 2201/10287* (2013.01)

(56) References Cited

U.S. PATENT DOCUMENTS

| | | |
|---|---|---|
| 4,304,235 A | 12/1981 | Kaufman |
| 4,416,288 A | 11/1983 | Freeman |
| 4,658,153 A | 4/1987 | Brosh |
| 5,306,917 A | 4/1994 | Black |
| 5,326,521 A | 7/1994 | East |
| 5,331,966 A | 7/1994 | Bennett |
| 5,360,987 A | 11/1994 | Shibib |
| 5,454,270 A | 10/1995 | Brown |
| 5,473,512 A * | 12/1995 | Degani ............ H01L 23/04 174/256 |
| 5,491,651 A | 2/1996 | Janic |
| 5,567,975 A | 10/1996 | Walsh |
| 5,580,794 A | 12/1996 | Allen |
| 5,617,870 A | 4/1997 | Hastings |
| 5,811,790 A | 9/1998 | Endo |
| 5,817,008 A | 10/1998 | Rafert |
| 5,907,477 A | 5/1999 | Tuttle |
| 6,063,046 A | 5/2000 | Allum |
| 6,282,960 B1 | 9/2001 | Samuels et al. |
| 6,343,514 B1 | 2/2002 | Smith |
| 6,387,052 B1 | 5/2002 | Quinn |
| 6,421,016 B1 | 7/2002 | Phillips |
| 6,567,158 B1 | 5/2003 | Falcial |
| 6,641,860 B1 | 11/2003 | Kaiserman |
| 6,775,906 B1 | 8/2004 | Silverbrook |
| 6,784,844 B1 | 8/2004 | Boakes |
| 6,965,160 B2 | 11/2005 | Cobbley |
| 6,987,314 B1 | 1/2006 | Yoshida |
| 7,259,030 B2 | 8/2007 | Daniels |
| 7,265,298 B2 | 9/2007 | Maghribi |
| 7,302,751 B2 | 12/2007 | Hamburgen |
| 7,337,012 B2 | 2/2008 | Maghribi |
| 7,487,587 B2 | 2/2009 | Vanfleteren |
| 7,491,892 B2 | 2/2009 | Wagner |
| 7,521,292 B2 | 4/2009 | Rogers |
| 7,557,367 B2 | 7/2009 | Rogers |
| 7,618,260 B2 | 11/2009 | Daniel |
| 7,622,367 B1 | 11/2009 | Nuzzo |
| 7,727,228 B2 | 6/2010 | Abboud |
| 7,739,791 B2 * | 6/2010 | Brandenburg .... B29C 45/14377 174/529 |
| 7,759,167 B2 | 7/2010 | Vanfleteren |
| 7,960,246 B2 | 6/2011 | Flamand |
| 7,982,296 B2 | 7/2011 | Nuzzo |
| 8,097,926 B2 | 1/2012 | De Graff |
| 8,198,621 B2 | 6/2012 | Rogers |
| 8,207,473 B2 * | 6/2012 | Axisa ............... B32B 37/185 174/254 |
| 8,217,381 B2 | 7/2012 | Rogers |
| 8,372,726 B2 | 2/2013 | De Graff |
| 8,389,862 B2 | 3/2013 | Arora |
| 8,431,828 B2 | 4/2013 | Vanfleteren |
| 8,440,546 B2 | 5/2013 | Nuzzo |
| 8,536,667 B2 | 9/2013 | De Graff |
| 8,552,299 B2 | 10/2013 | Rogers |
| 8,664,699 B2 | 3/2014 | Nuzzo |
| 8,679,888 B2 | 3/2014 | Rogers |
| 8,729,524 B2 | 5/2014 | Rogers |
| 8,754,396 B2 | 6/2014 | Rogers |
| 8,865,489 B2 | 10/2014 | Rogers |
| 8,886,334 B2 | 11/2014 | Ghaffari |
| 8,905,772 B2 | 12/2014 | Rogers |
| 9,012,784 B2 | 4/2015 | Arora |
| 9,082,025 B2 | 7/2015 | Fastert |
| 9,105,555 B2 | 8/2015 | Rogers |
| 9,105,782 B2 | 8/2015 | Rogers |
| 9,119,533 B2 | 9/2015 | Ghaffari |
| 9,123,614 B2 | 9/2015 | Graff |
| 9,159,635 B2 | 10/2015 | Elolampi |
| 9,168,094 B2 | 10/2015 | Lee |
| 9,171,794 B2 | 10/2015 | Rafferty |
| 9,186,060 B2 | 11/2015 | De Graff |
| 9,226,402 B2 | 12/2015 | Hsu |
| 9,247,637 B2 | 1/2016 | Hsu |
| 2001/0012918 A1 | 8/2001 | Swanson |
| 2001/0021867 A1 | 9/2001 | Kordis |
| 2002/0026127 A1 | 2/2002 | Balbierz |
| 2002/0082515 A1 | 6/2002 | Campbell |
| 2002/0094701 A1 | 7/2002 | Biegelsen |
| 2002/0113739 A1 | 8/2002 | Howard |
| 2002/0128700 A1 | 9/2002 | Cross, Jr. |
| 2002/0145467 A1 | 10/2002 | Minch |
| 2002/0151934 A1 | 10/2002 | Levine |
| 2002/0158330 A1 | 10/2002 | Moon |
| 2003/0017848 A1 | 1/2003 | Engstrom |
| 2003/0045025 A1 | 3/2003 | Coyle |
| 2003/0097165 A1 | 5/2003 | Krulevitch |
| 2003/0120271 A1 | 6/2003 | Burnside |
| 2003/0162507 A1 | 8/2003 | Vatt |
| 2003/0214408 A1 | 11/2003 | Grajales |
| 2003/0236455 A1 | 12/2003 | Swanson |
| 2004/0006264 A1 | 1/2004 | Mojarradi |
| 2004/0085469 A1 | 5/2004 | Johnson |
| 2004/0092806 A1 | 5/2004 | Sagon |
| 2004/0106334 A1 | 6/2004 | Suzuki |
| 2004/0135094 A1 | 7/2004 | Niigaki |
| 2004/0138558 A1 | 7/2004 | Dunki-Jacobs |
| 2004/0149921 A1 | 8/2004 | Smyk |
| 2004/0178466 A1 | 9/2004 | Merrill |
| 2004/0192082 A1 | 9/2004 | Wagner |
| 2004/0201134 A1 | 10/2004 | Kawai |
| 2004/0203486 A1 | 10/2004 | Shepherd |
| 2004/0221370 A1 | 11/2004 | Hannula |
| 2004/0243204 A1 | 12/2004 | Maghribi |
| 2005/0021103 A1 | 1/2005 | DiLorenzo |
| 2005/0067293 A1 | 3/2005 | Naito |
| 2005/0070778 A1 | 3/2005 | Lackey |
| 2005/0096513 A1 | 5/2005 | Ozguz |
| 2005/0113744 A1 | 5/2005 | Donoghue |
| 2005/0139683 A1 | 6/2005 | Yi |
| 2005/0171524 A1 | 8/2005 | Stern |
| 2005/0203366 A1 | 9/2005 | Donoghue |
| 2006/0003709 A1 | 1/2006 | Wood |
| 2006/0038182 A1 | 2/2006 | Rogers |
| 2006/0071349 A1 | 4/2006 | Tokushige |
| 2006/0084394 A1 | 4/2006 | Engstrom |
| 2006/0106321 A1 | 5/2006 | Lewinsky |
| 2006/0128346 A1 | 6/2006 | Yasui |
| 2006/0154398 A1 | 7/2006 | Qing |
| 2006/0160560 A1 | 7/2006 | Josenhans |
| 2006/0248946 A1 | 11/2006 | Howell |
| 2006/0257945 A1 | 11/2006 | Masters |
| 2006/0264767 A1 | 11/2006 | Shennib |
| 2006/0286785 A1 | 12/2006 | Rogers |
| 2007/0027514 A1 | 2/2007 | Gerber |
| 2007/0031283 A1 | 2/2007 | Davis |
| 2007/0108389 A1 | 5/2007 | Makela |
| 2007/0113399 A1 | 5/2007 | Kumar |
| 2007/0123756 A1 | 5/2007 | Kitajima |
| 2007/0270672 A1 | 11/2007 | Hayter |
| 2008/0046080 A1 | 2/2008 | Vanden Bulcke |
| 2008/0074383 A1 | 3/2008 | Dean |
| 2008/0096620 A1 | 4/2008 | Lee |
| 2008/0139894 A1 | 6/2008 | Szydlo-Moore |
| 2008/0157235 A1 | 7/2008 | Rogers |
| 2008/0193749 A1 | 8/2008 | Thompson |
| 2008/0204021 A1 | 8/2008 | Leussler |
| 2008/0211087 A1 | 9/2008 | Mueller-Hipper |
| 2008/0237840 A1 | 10/2008 | Alcoe |

(56) References Cited

U.S. PATENT DOCUMENTS

| | | | |
|---|---|---|---|
| 2008/0257589 A1* | 10/2008 | Ostmann | H05K 1/0271 |
| | | | 174/254 |
| 2008/0259576 A1 | 10/2008 | Johnson | |
| 2008/0287167 A1 | 11/2008 | Caine | |
| 2008/0313552 A1 | 12/2008 | Buehler | |
| 2009/0000377 A1 | 1/2009 | Shipps | |
| 2009/0001550 A1 | 1/2009 | Li et al. | |
| 2009/0015560 A1 | 1/2009 | Robinson | |
| 2009/0017884 A1 | 1/2009 | Rotschild | |
| 2009/0048556 A1 | 2/2009 | Durand | |
| 2009/0088750 A1 | 4/2009 | Hushka | |
| 2009/0107704 A1 | 4/2009 | Vanfleteren | |
| 2009/0154736 A1 | 6/2009 | Lee | |
| 2009/0184254 A1 | 7/2009 | Miura | |
| 2009/0204168 A1 | 8/2009 | Kallmeyer | |
| 2009/0215385 A1 | 8/2009 | Waters | |
| 2009/0225751 A1 | 9/2009 | Koenck | |
| 2009/0261828 A1 | 10/2009 | Nordmeyer-Massner | |
| 2009/0273909 A1 | 11/2009 | Shin | |
| 2009/0291508 A1 | 11/2009 | Babu | |
| 2009/0294803 A1 | 12/2009 | Nuzzo | |
| 2009/0322480 A1 | 12/2009 | Benedict | |
| 2010/0002402 A1 | 1/2010 | Rogers | |
| 2010/0059863 A1 | 3/2010 | Rogers | |
| 2010/0072577 A1 | 3/2010 | Nuzzo | |
| 2010/0073669 A1 | 3/2010 | Colvin | |
| 2010/0087782 A1 | 4/2010 | Ghaffari | |
| 2010/0090781 A1 | 4/2010 | Yamamoto | |
| 2010/0090824 A1 | 4/2010 | Rowell | |
| 2010/0116526 A1 | 5/2010 | Arora | |
| 2010/0117660 A1 | 5/2010 | Douglas | |
| 2010/0178722 A1 | 7/2010 | De Graff | |
| 2010/0245011 A1 | 9/2010 | Chatzopoulos | |
| 2010/0271191 A1 | 10/2010 | De Graff | |
| 2010/0298895 A1 | 11/2010 | Ghaffari | |
| 2010/0317132 A1 | 12/2010 | Rogers | |
| 2010/0321161 A1 | 12/2010 | Isabell | |
| 2010/0327387 A1 | 12/2010 | Kasai | |
| 2011/0011179 A1 | 1/2011 | Gustafsson | |
| 2011/0034912 A1 | 2/2011 | De Graff | |
| 2011/0051384 A1 | 3/2011 | Kriechbaum | |
| 2011/0054583 A1 | 3/2011 | Litt | |
| 2011/0101789 A1 | 5/2011 | Salter | |
| 2011/0121822 A1 | 5/2011 | Parsche | |
| 2011/0140897 A1 | 6/2011 | Purks | |
| 2011/0175735 A1 | 7/2011 | Forster | |
| 2011/0184320 A1 | 7/2011 | Shipps | |
| 2011/0215931 A1 | 9/2011 | Callsen | |
| 2011/0218756 A1 | 9/2011 | Callsen | |
| 2011/0218757 A1 | 9/2011 | Callsen | |
| 2011/0220890 A1 | 9/2011 | Nuzzo | |
| 2011/0277813 A1 | 11/2011 | Rogers | |
| 2011/0306851 A1 | 12/2011 | Wang | |
| 2012/0016258 A1 | 1/2012 | Webster | |
| 2012/0051005 A1 | 3/2012 | Vanfleteren | |
| 2012/0052268 A1 | 3/2012 | Axisa | |
| 2012/0065937 A1 | 3/2012 | De Graff | |
| 2012/0074546 A1 | 3/2012 | Chong | |
| 2012/0087216 A1 | 4/2012 | Keung | |
| 2012/0091594 A1 | 4/2012 | Landesberger | |
| 2012/0092178 A1 | 4/2012 | Callsen | |
| 2012/0092222 A1 | 4/2012 | Kato | |
| 2012/0101413 A1 | 4/2012 | Beetel | |
| 2012/0101538 A1 | 4/2012 | Ballakur | |
| 2012/0108012 A1 | 5/2012 | Yasuda | |
| 2012/0157804 A1 | 6/2012 | Rogers | |
| 2012/0172697 A1 | 7/2012 | Urman | |
| 2012/0226130 A1 | 9/2012 | De Graff | |
| 2012/0244848 A1 | 9/2012 | Ghaffari | |
| 2012/0256308 A1 | 10/2012 | Helin | |
| 2012/0316455 A1 | 12/2012 | Rahman | |
| 2012/0327608 A1 | 12/2012 | Rogers | |
| 2013/0041235 A1 | 2/2013 | Rogers | |
| 2013/0099358 A1 | 4/2013 | Elolampi | |
| 2013/0100618 A1 | 4/2013 | Rogers | |
| 2013/0118255 A1 | 5/2013 | Callsen | |
| 2013/0150693 A1 | 6/2013 | D'angelo | |
| 2013/0185003 A1 | 7/2013 | Carbeck | |
| 2013/0192356 A1 | 8/2013 | De Graff | |
| 2013/0200268 A1 | 8/2013 | Rafferty | |
| 2013/0211761 A1 | 8/2013 | Brandsma | |
| 2013/0214300 A1 | 8/2013 | Lerman | |
| 2013/0215467 A1 | 8/2013 | Fein | |
| 2013/0225965 A1 | 8/2013 | Ghaffari | |
| 2013/0237150 A1 | 9/2013 | Royston | |
| 2013/0245388 A1 | 9/2013 | Rafferty | |
| 2013/0274562 A1 | 10/2013 | Ghaffari | |
| 2013/0313713 A1 | 11/2013 | Arora | |
| 2013/0316442 A1 | 11/2013 | Meurville | |
| 2013/0316487 A1 | 11/2013 | De Graff | |
| 2013/0320503 A1 | 12/2013 | Nuzzo | |
| 2013/0321373 A1 | 12/2013 | Yoshizumi | |
| 2014/0001058 A1 | 1/2014 | Ghaffari | |
| 2014/0012160 A1 | 1/2014 | Ghaffari | |
| 2014/0012242 A1 | 1/2014 | Lee | |
| 2014/0022746 A1 | 1/2014 | Hsu | |
| 2014/0039290 A1 | 2/2014 | De Graff | |
| 2014/0097944 A1 | 4/2014 | Fastert | |
| 2014/0110859 A1 | 4/2014 | Rafferty | |
| 2014/0140020 A1 | 5/2014 | Rogers | |
| 2014/0188426 A1 | 7/2014 | Fastert | |
| 2014/0191236 A1 | 7/2014 | Nuzzo | |
| 2014/0216524 A1 | 8/2014 | Rogers | |
| 2014/0240932 A1 | 8/2014 | Hsu | |
| 2014/0249520 A1 | 9/2014 | Ghaffari | |
| 2014/0303452 A1 | 10/2014 | Ghaffari | |
| 2014/0340857 A1 | 11/2014 | Hsu | |
| 2014/0374872 A1 | 12/2014 | Rogers | |
| 2014/0375465 A1 | 12/2014 | Fenuccio | |
| 2015/0001462 A1 | 1/2015 | Rogers | |
| 2015/0019135 A1 | 1/2015 | Kacyvenski | |
| 2015/0035680 A1 | 2/2015 | Li | |
| 2015/0069617 A1 | 3/2015 | Arora | |
| 2015/0099976 A1 | 4/2015 | Ghaffari | |
| 2015/0100135 A1 | 4/2015 | Ives | |
| 2015/0194817 A1 | 7/2015 | Lee | |
| 2015/0237711 A1 | 8/2015 | Rogers | |
| 2015/0241288 A1 | 8/2015 | Keen | |
| 2015/0260713 A1 | 9/2015 | Ghaffari | |
| 2015/0272652 A1 | 10/2015 | Ghaffari | |
| 2015/0286913 A1 | 10/2015 | Fastert | |
| 2015/0320472 A1 | 11/2015 | Ghaffari | |
| 2015/0335254 A1 | 11/2015 | Fastert et al. | |
| 2015/0342036 A1 | 11/2015 | Elolampi et al. | |

FOREIGN PATENT DOCUMENTS

| | | |
|---|---|---|
| JP | 05-087511 A | 4/1993 |
| JP | 2009-170173 A | 7/2009 |
| WO | WO 99/38211 A2 | 7/1999 |
| WO | WO 03/021679 A2 | 3/2003 |
| WO | WO 2005/122285 A2 | 12/2005 |
| WO | WO 2007/003019 A2 | 1/2007 |
| WO | WO 2007/116344 A1 | 10/2007 |
| WO | WO 2007/136726 A2 | 11/2007 |
| WO | WO 2008/030960 A2 | 3/2008 |
| WO | WO 2009/111641 A1 | 9/2009 |
| WO | WO 2009/114689 A1 | 9/2009 |
| WO | WO 2010/036807 A1 | 4/2010 |
| WO | WO 2010/042653 A1 | 4/2010 |
| WO | WO 2010/042957 A2 | 4/2010 |
| WO | WO 2010/046883 A1 | 4/2010 |
| WO | WO 2010/056857 A2 | 5/2010 |
| WO | WO 2010/081137 A2 | 7/2010 |
| WO | WO 2010/082993 A2 | 7/2010 |
| WO | WO 2010/102310 A2 | 9/2010 |
| WO | WO 2010/132552 A1 | 11/2010 |
| WO | WO 2011/003181 A1 | 1/2011 |
| WO | WO 2011/041727 A1 | 4/2011 |
| WO | WO 2011/084450 A1 | 7/2011 |
| WO | WO 2011/084709 A2 | 7/2011 |
| WO | WO 2011/127331 A2 | 10/2011 |
| WO | WO 2012/125494 A2 | 9/2012 |
| WO | WO 2012/166686 A2 | 12/2012 |

(56) References Cited

FOREIGN PATENT DOCUMENTS

| | | |
|---|---|---|
| WO | WO 2013/010171 A1 | 1/2013 |
| WO | WO 2013/022853 A1 | 2/2013 |
| WO | WO 2013/033724 A1 | 3/2013 |
| WO | WO 2013/034987 A3 | 3/2013 |
| WO | WO 2013/049716 A1 | 4/2013 |
| WO | WO 2013/052919 A2 | 4/2013 |
| WO | WO 2013/170032 A2 | 11/2013 |
| WO | WO 2014/007871 A1 | 1/2014 |
| WO | WO 2014/058473 A1 | 4/2014 |
| WO | WO 2014/059032 A1 | 4/2014 |
| WO | WO 2014/106041 A1 | 7/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |
| WO | WO 2015/054312 A1 | 4/2015 |
| WO | WO 2015/077559 A1 | 5/2015 |
| WO | WO 2015/080991 A1 | 6/2015 |
| WO | WO 2015/102951 A2 | 7/2015 |
| WO | WO 2015/103483 A1 | 7/2015 |
| WO | WO 2015/103580 A2 | 7/2015 |
| WO | WO 2015/127458 A1 | 8/2015 |
| WO | WO 2015/134588 A1 | 9/2015 |
| WO | WO 2015/138712 A1 | 9/2015 |

OTHER PUBLICATIONS

Demura et al., "Immobilization of Glucose Oxidase with *Bombyx mori* Silk Fibroin by Only Stretching Treatment and its Application to Glucose Sensor," Biotechnology and Bioengineering, vol. 33, 598-603 (6 pages) (1989).

Ellerbee et al., "Quantifying Colorimetric Assays in Paper-Based Microfluidic Devices by Measuring the Transmission of Light through Paper," Analytical Chemistry, vol. 81, No. 20 8447-8452, (6 pages) (Oct. 15, 2009).

Halsted, "Ligature and Suture Material," Journal of the American Medical Association, vol. LX, No. 15, 1119-1126, (8 pages) (Apr. 12, 1913).

Kim et al., "Complementary Metal Oxide Silicon Integrated Circuits Incorporating Monolithically Integrated Stretchable Wavy Interconnects," Applied Physics Letters, vol. 93, 044102-044102.3 (3 pages) (Jul. 31, 2008).

Kim et al., "Dissolvable Films of Silk Fibroin for Ultrathin Conformal Bio-Integrated Electronics," Nature, 1-8 (8 pages) (Apr. 18, 2010).

Kim et al., "Materials and Noncoplanar Mesh Designs for Integrated Circuits with Linear Elastic Responses to Extreme Mechanical Deformations," PNAS, vol. 105, No. 48, 18675-18680 (6 pages) (Dec. 2, 2008).

Kim et al., "Stretchable and Foldable Silicon Integrated Circuits," Science, vol. 320, 507-511 (5 pages) (Apr. 25, 2008).

Kim et al., "Electrowetting on Paper for Electronic Paper Display," ACS Applied Materials & Interfaces, vol. 2, No. 11, (3318-3323) (6 pages) (Nov. 24, 2010).

Ko et al., "A Hemispherical Electronic Eye Camera Based on Compressible Silicon Optoelectronics," Nature, vol. 454, 748-753 (6 pages) (Aug. 7, 2008).

Lawrence et al., "Bioactive Silk Protein Biomaterial Systems for Optical Devices," Biomacromolecules, vol. 9, 1214-1220 (7 pages) (Nov. 4, 2008).

Meitl et al., "Transfer Printing by Kinetic Control of Adhesion to an Elastomeric Stamp," Nature, vol. 5, 33-38 (6 pages) (Jan. 2006).

Omenetto et al., "A New Route for Silk," Nature Photonics, vol. 2, 641-643 (3 pages) (Nov. 2008).

Omenetto et al., "New Opportunities for an Ancient Material," Science, vol. 329, 528-531 (5 pages) (Jul. 30, 2010).

Siegel et al., "Foldable Printed Circuit Boards on Paper Substrates," Advanced Functional Materials, vol. 20, No. 1, 28-35, (8 pages) (Jan. 8, 2010).

Tsukada et al., "Structural Changes of Silk Fibroin Membranes Induced by Immersion in Methanol Aqueous Solutions," Journal of Polymer Science, vol. 32, 961-968 (8 pages) (1994).

Wang et al., "Controlled Release From Multilayer Silk Biomaterial Coatings to Modulate Vascular Cell Responses" Biomaterials, 29, 894-903 (10 pages) (Nov. 28, 2008).

International Search Report, PCT/US2014/017968, 2 pages, date of mailing Mar. 13, 2015.

\* cited by examiner

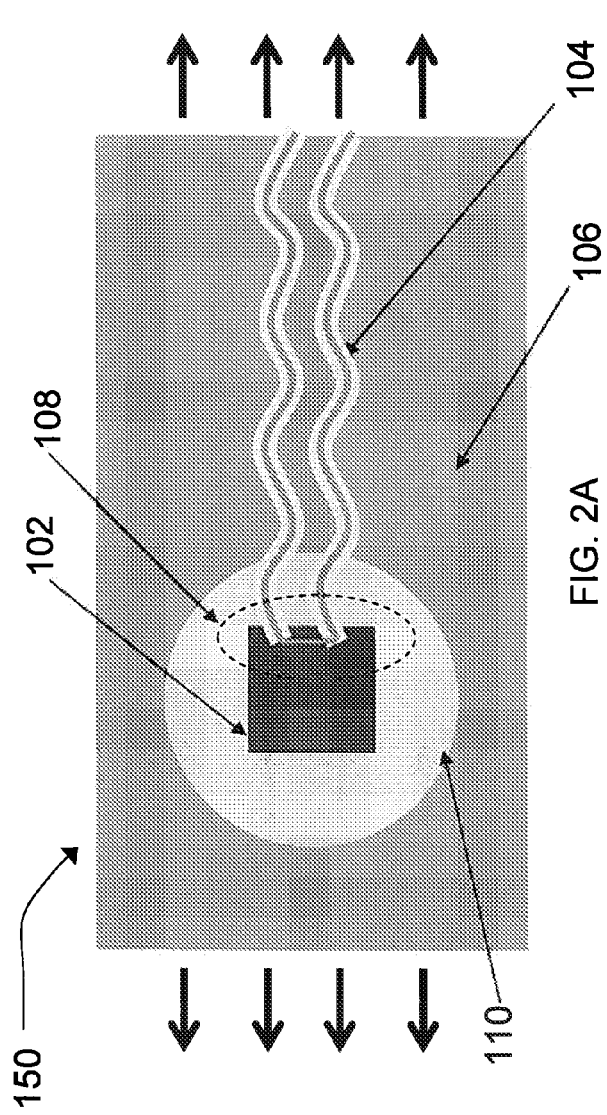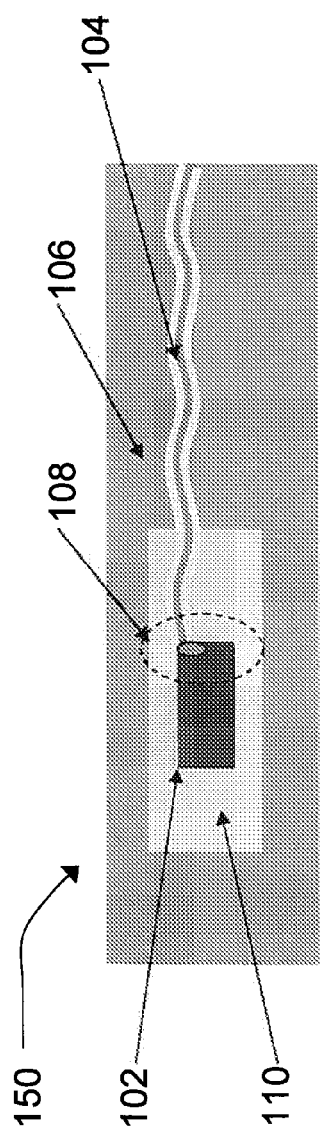
FIG. 2A
FIG. 2B

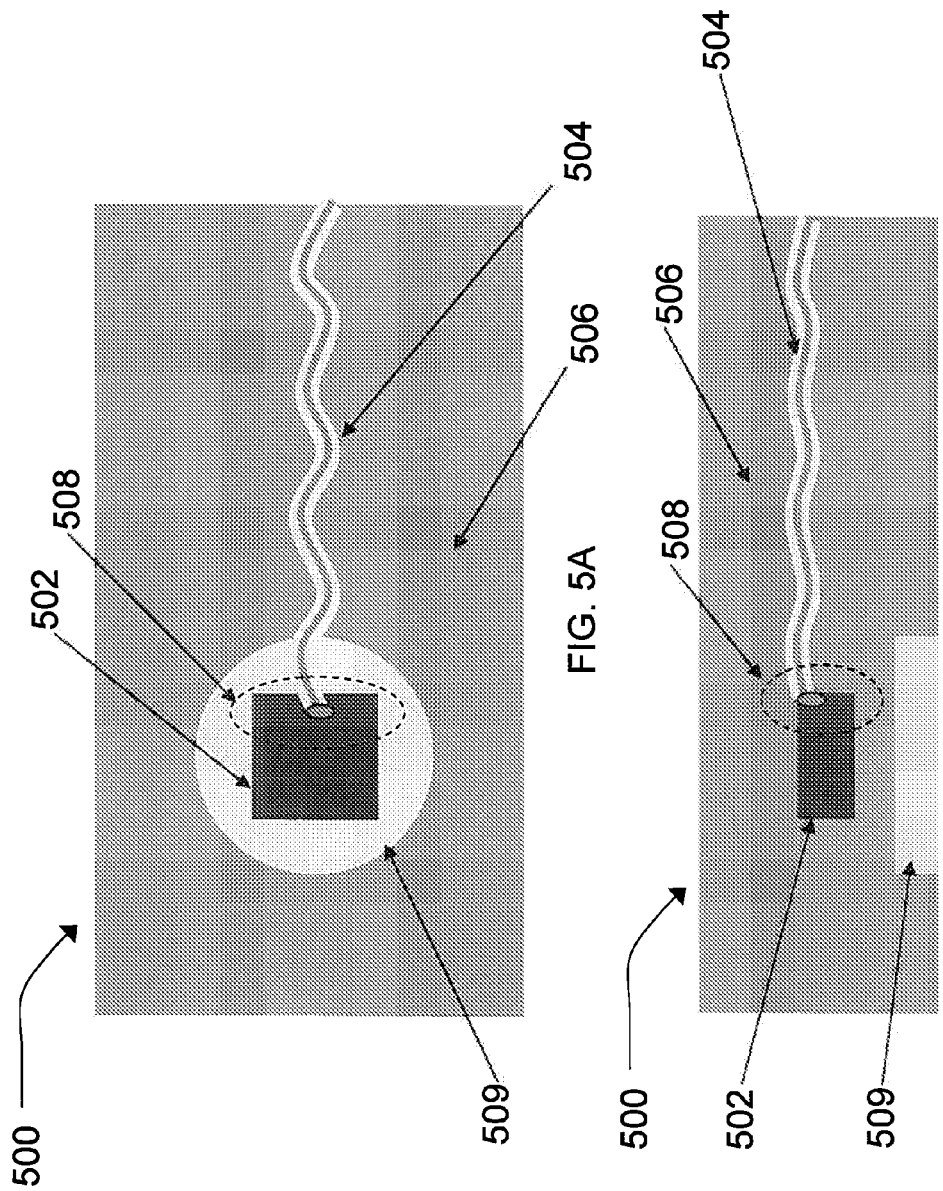

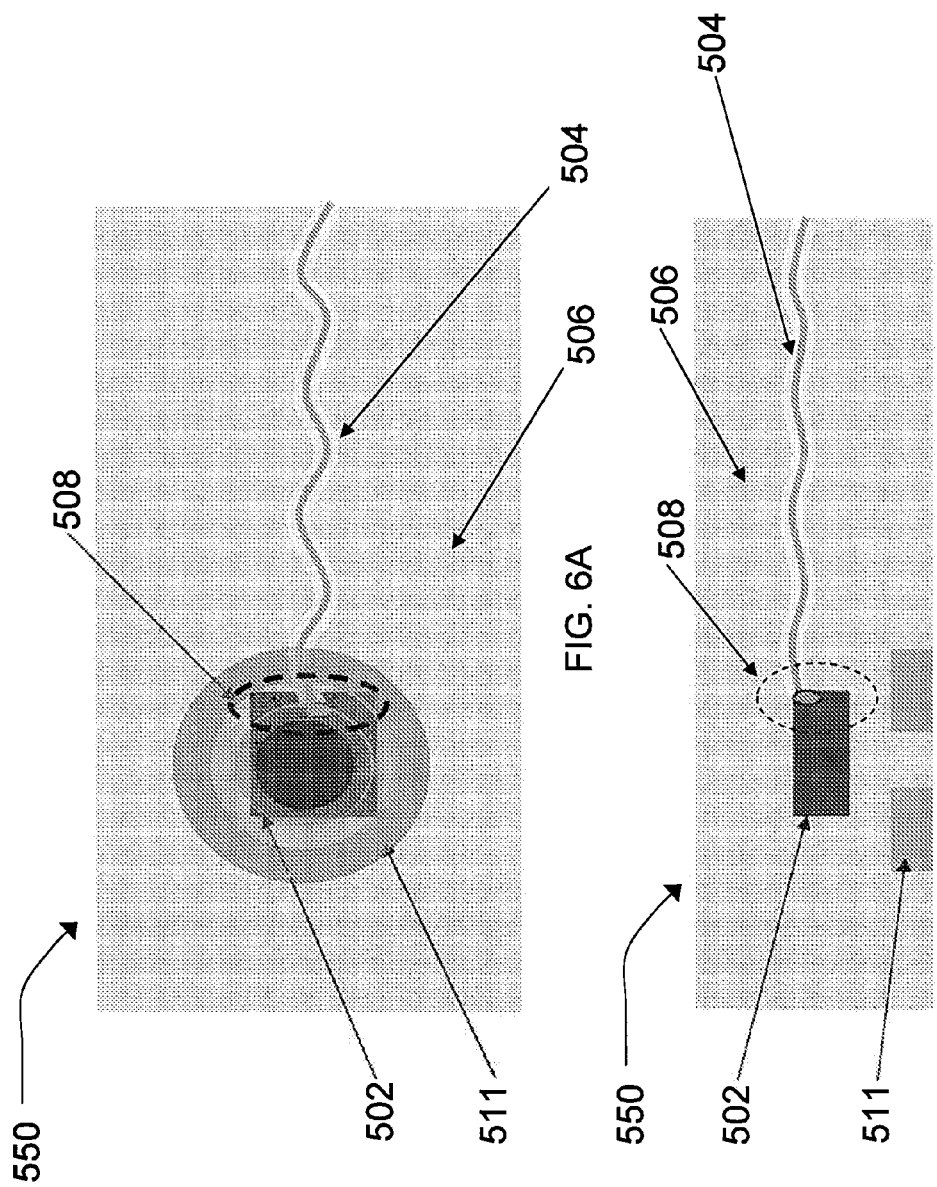

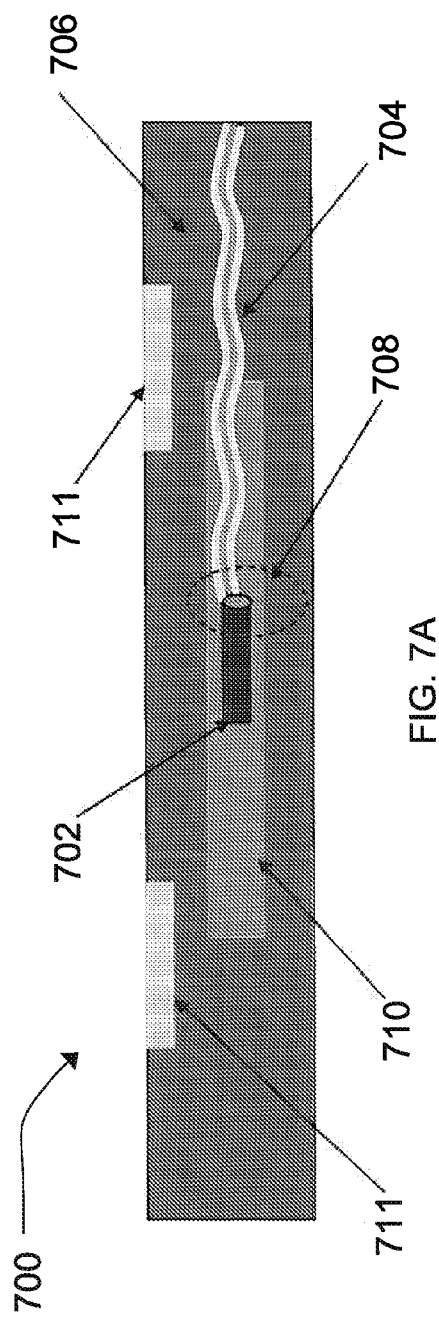
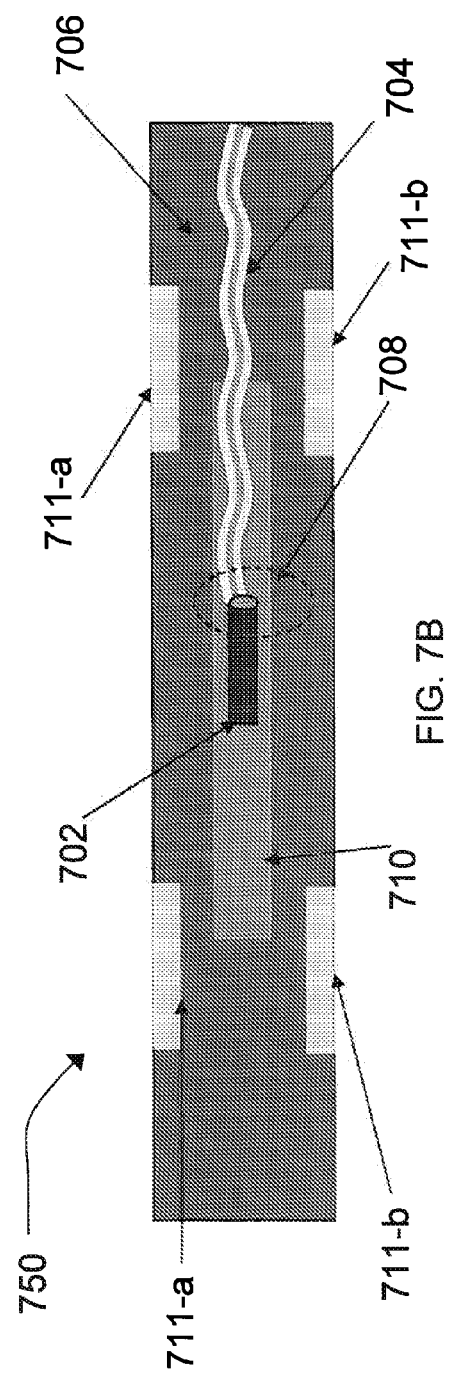
FIG. 7A
FIG. 7B

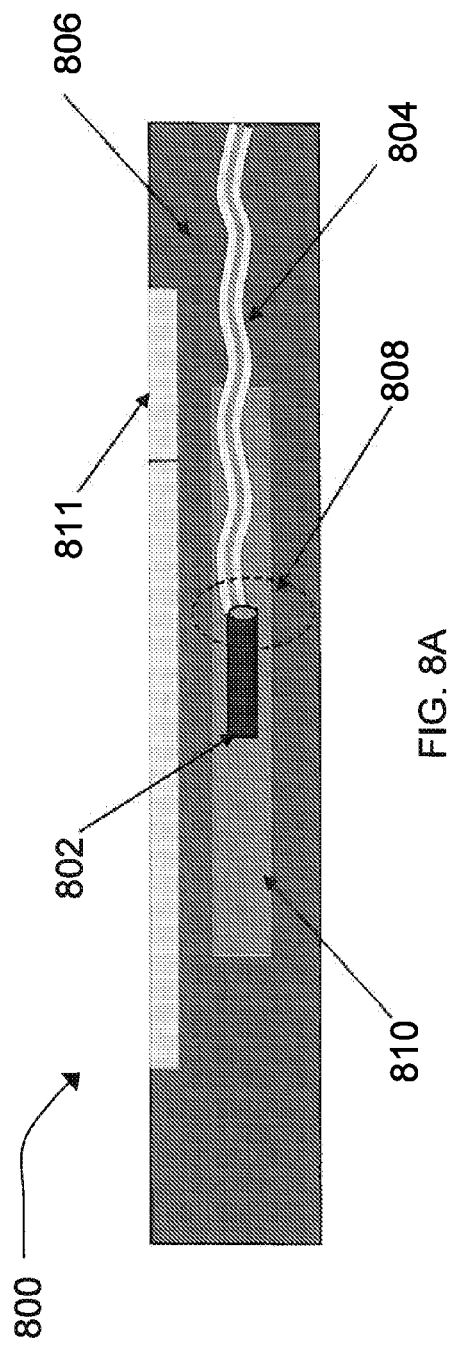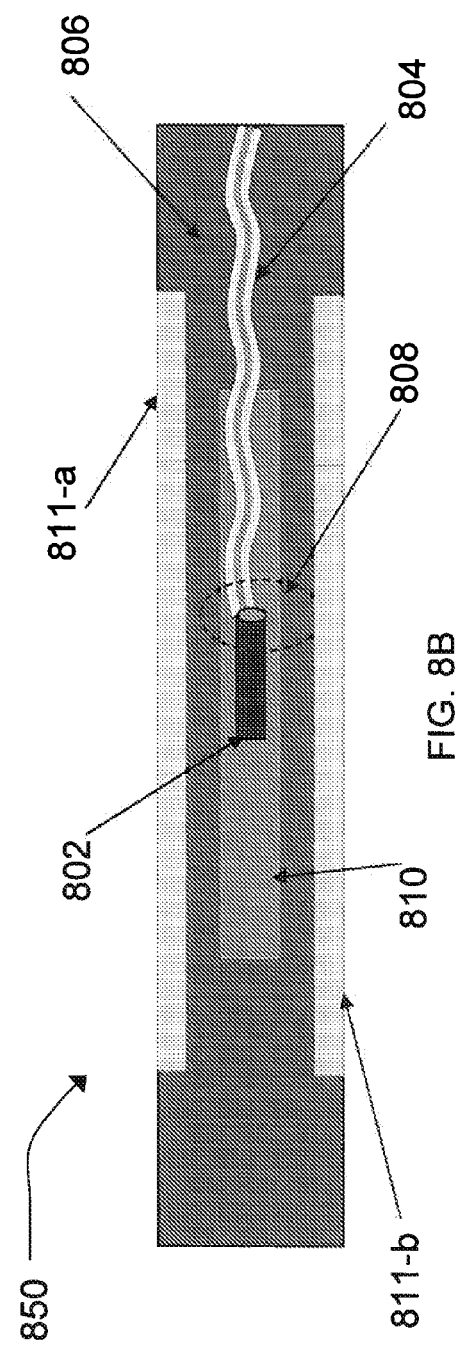

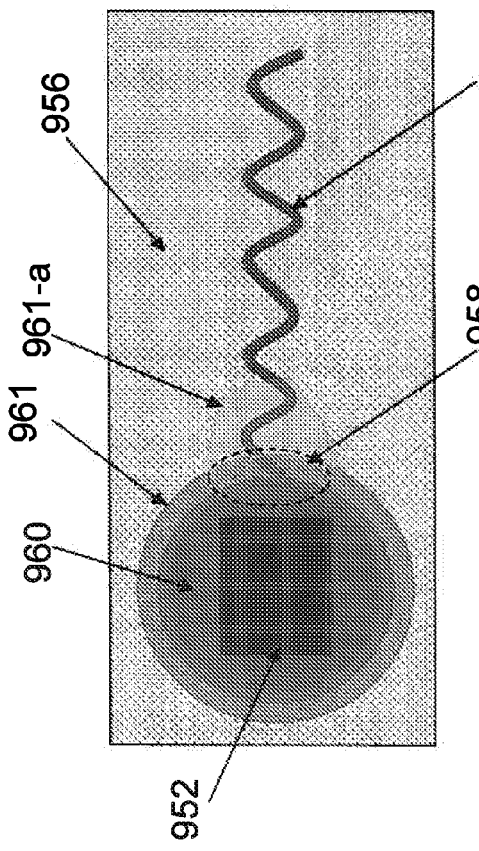
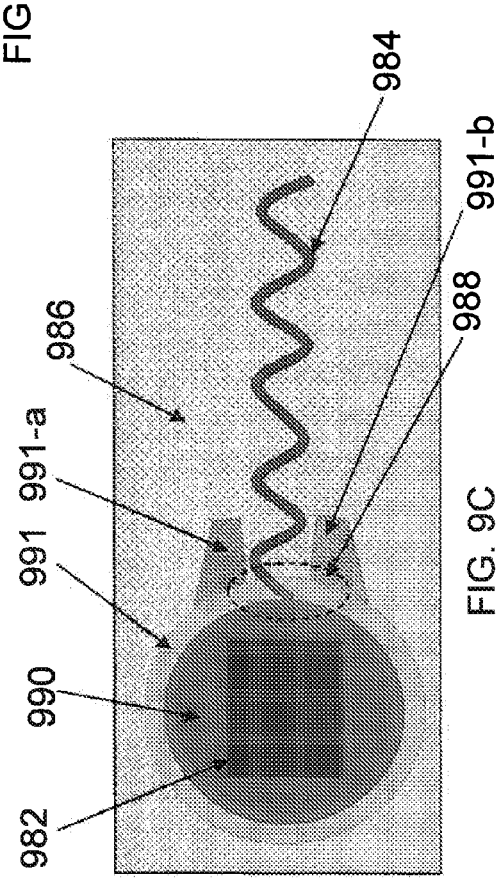
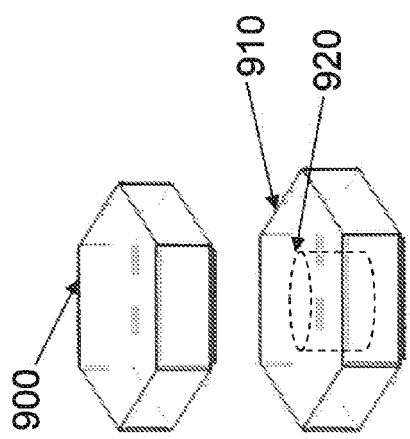

STRAIN ISOLATION STRUCTURES FOR STRETCHABLE ELECTRONICS

CROSS-REFERENCE TO RELATED APPLICATIONS

This application is a continuation of U.S. application Ser. No. 13/843,873, filed Mar. 15, 2013, which claims priority to and the benefit of U.S. Provisional Application No. 61/658,140, filed Jun. 11, 2012, and U.S. Provisional Application No. 61/768,939, filed on Feb. 25, 2013, each of which is hereby incorporated by reference herein in its entirety.

BACKGROUND

High quality medical sensing and imaging data has become increasingly beneficial in the diagnoses and treatment of a variety of medical conditions. The conditions can be associated with the digestive system, the cardio-circulatory system, and can include injuries to the nervous system, cancer, and the like. To date, most electronic systems that could be used to gather such sensing or imaging data have been rigid and inflexible. These rigid electronics are not ideal for many applications, such as in biomedical devices. Most of biological tissue is soft and curved. The skin and organs are delicate and far from two-dimensional.

Other potential applications of electronics systems, such as for gathering data in non-medical systems, also can be hampered by rigid electronics.

SUMMARY

The Inventors have recognized that the inflexibility of electronic systems in use are not ideal for many applications.

In view of the foregoing, various examples described herein are directed generally to systems, apparatus and methods for providing strain isolation in a conformable electronic system. The systems, methods and apparatus described herein provide effective, compact, and complex systems that include stretchable and/or flexible interconnects in electrical communication with more rigid device components.

In an example, buffer structures are described that effectively redistributes the strain that might normally act at or near an edge of the more rigid device component or on a junction region between the stretchable and/or flexible interconnects and the more rigid device components.

In an example, a system, apparatus and method is provided that is based on thin device islands, including integrated circuitry (IC) chips and/or stretchable and/or flexible interconnects that are encapsulated in an encapsulant.

In an example, a system, apparatus and method is provided that includes a device component, at least one conductive stretchable and/or flexible interconnect in electrical communication with the device component, the at least one conductive stretchable and/or flexible interconnect forming the electrical communication with the device component at a junction region, a buffer structure, and an encapsulant encapsulating at least the device component and the junction region. The buffer structure overlaps with at least a portion of the junction region. The buffer structure has a higher value of Young's modulus than the encapsulant.

In an example, a system, apparatus and method is provided that includes a device component, at least one conductive stretchable and/or flexible interconnect in electrical communication with the device component, the at least one conductive stretchable and/or flexible interconnect forming the electrical communication with the device component at a junction region, a first buffer structure disposed over the device component, a second buffer structure disposed below the device component, and an encapsulant encapsulating at least the device component and the junction region. The first buffer structure and the second buffer structure overlap with at least a portion of the junction region. The first buffer structure and the second buffer structure have a higher value of Young's modulus than the encapsulant.

In an example, a system, apparatus and method is provided that includes a device component, a flexible base, the device component being disposed on, or at least partially embedded in, the flexible base, at least one conductive stretchable and/or flexible interconnect in electrical communication with the device component, the at least one conductive stretchable and/or flexible interconnect forming the electrical communication with the device component at a junction region, a buffer structure, and an encapsulant encapsulating at least the device component and the junction region. The buffer structure overlaps with at least a portion of the flexible base. The flexible base has a higher value of Young's modulus than the encapsulant. The buffer structure has a higher value of Young's modulus than the encapsulant.

The following publications, patents, and patent applications are hereby incorporated herein by reference in their entirety:

Kim et al., "Stretchable and Foldable Silicon Integrated Circuits," Science Express, Mar. 27, 2008, 10.1126/science.1154367;

Ko et al., "A Hemispherical Electronic Eye Camera Based on Compressible Silicon Optoelectronics," Nature, Aug. 7, 2008, vol. 454, pp. 748-753;

Kim et al., "Complementary Metal Oxide Silicon Integrated Circuits Incorporating Monolithically Integrated Stretchable Wavy Interconnects," Applied Physics Letters, Jul. 31, 2008, vol. 93, 044102;

Kim et al., "Materials and Noncoplanar Mesh Designs for Integrated Circuits with Linear Elastic Responses to Extreme Mechanical Deformations," PNAS, Dec. 2, 2008, vol. 105, no. 48, pp. 18675-18680;

Meitl et al., "Transfer Printing by Kinetic Control of Adhesion to an Elastomeric Stamp," Nature Materials, January, 2006, vol. 5, pp. 33-38;

U.S. Patent Application publication no. 2010 0002402-A1, published Jan. 7, 2010, filed Mar. 5, 2009, and entitled "STRETCHABLE AND FOLDABLE ELECTRONIC DEVICES;"

U.S. Patent Application publication no. 2010 0087782-A1, published Apr. 8, 2010, filed Oct. 7, 2009, and entitled "CATHETER BALLOON HAVING STRETCHABLE INTEGRATED CIRCUITRY AND SENSOR ARRAY;"

U.S. Patent Application publication no. 2010 0116526-A1, published May 13, 2010, filed Nov. 12, 2009, and entitled "EXTREMELY STRETCHABLE ELECTRONICS;"

U.S. Patent Application publication no. 2010 0178722-A1, published Jul. 15, 2010, filed Jan. 12, 2010, and entitled "METHODS AND APPLICATIONS OF NON-PLANAR IMAGING ARRAYS;" and U.S. Patent Application publication no. 2010 027119-A1, published Oct. 28, 2010, filed Nov. 24, 2009, and entitled "SYSTEMS, DEVICES, AND METHODS UTILIZING STRETCHABLE ELECTRONICS TO MEASURE TIRE OR ROAD SURFACE CONDITIONS."

Kim, D. H. et al. (2010). Dissolvable films of silk fibroin for ultrathin conformal bio-integrated electronics. *Nature Materials*, 9, 511-517.

Omenetto, F. G. and D. L. Kaplan. (2008). A new route for silk. *Nature Photonics*, 2, 641-643.

Omenetto, F. G., Kaplan, D. L. (2010). New opportunities for an ancient material. *Science,* 329, 528-531.

Halsed, W. S. (1913). Ligature and suture material. *Journal of the American Medical Association,* 60, 1119-1126.

Masuhiro, T., Yoko, G., Masaobu, N., et al. (1994). Structural changes of silk fibroin membranes induced by immersion in methanol aqueous solutions. *Journal of Polymer Science,* 5, 961-968.

Lawrence, B. D., Cronin-Golomb, M., Georgakoudi, I., et al. (2008). Bioactive silk protein biomaterial systems for optical devices. *Biomacromolecules,* 9, 1214-1220.

Demura, M., Asakura, T. (1989). Immobilization of glucose oxidase with *Bombyx mori* silk fibroin by only stretching treatment and its application to glucose sensor. *Biotechnololgy and Bioengineering,* 33, 598-603.

Wang, X., Zhang, X., Castellot, J. et al. (2008). Controlled release from multilayer silk biomaterial coatings to modulate vascular cell responses. *Biomaterials,* 29, 894-903.

U.S. patent application Ser. No. 12/723,475 entitled "SYSTEMS, METHODS, AND DEVICES FOR SENSING AND TREATMENT HAVING STRETCHABLE INTEGRATED CIRCUITRY," filed Mar. 12, 2010.

U.S. patent application Ser. No. 12/686,076 entitled "Methods and Applications of Non-Planar Imaging Arrays," filed Jan. 12, 2010.

U.S. patent application Ser. No. 12/636,071 entitled "Systems, Methods, and Devices Using Stretchable or Flexible Electronics for Medical Applications," filed Dec. 11, 2009.

U.S. Patent Application publication no 2012-0065937-A1, published Mar. 15, 2012, and entitled "METHODS AND APPARATUS FOR MEASURING TECHNICAL PARAMETERS OF EQUIPMENT, TOOLS AND COMPONENTS VIA CONFORMAL ELECTRONICS."

U.S. patent application Ser. No. 12/616,922 entitled "Extremely Stretchable Electronics," filed Nov. 12, 2009.

U.S. patent application Ser. No. 12/575,008 entitled "Catheter Balloon Having Stretchable Integrated Circuitry and Sensor Array," filed on Oct. 7, 2009.

U.S. patent application Ser. No. 13/336,518 entitled "Systems, Methods, and Devices Having Stretchable Integrated Circuitry for Sensing and Delivering Therapy," filed Dec. 23, 2011.

It should be appreciated that all combinations of the foregoing concepts and additional concepts described in greater detail below (provided such concepts are not mutually inconsistent) are contemplated as being part of the inventive subject matter disclosed herein. It also should be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the figures, described herein, are for illustration purposes only, and that the drawings are not intended to limit the scope of the disclosed teachings in any way. In some instances, various aspects or features may be shown exaggerated or enlarged to facilitate an understanding of the inventive concepts disclosed herein (the drawings are not necessarily to scale, emphasis instead being placed upon illustrating the principles of the teachings). In the drawings, like reference characters generally refer to like features, functionally similar and/or structurally similar elements throughout the various figures.

FIGS. 2A and 2B show top and cross-sectional side views of an example conformable electronic system, according to the principles described herein.

FIGS. 5A-5B show top and cross-sectional side views of an example apparatus, according to the principles described herein.

FIGS. 6A-6B show top and cross-sectional side views of another example apparatus, according to the principles described herein.

FIG. 7A-7B show cross-sectional side views of other example apparatus, according to the principles described herein.

FIG. 8A-8B show cross-sectional side views of other example apparatus, according to the principles described herein.

FIG. 9A show examples of buffer structures that have a substantially polygonal prism conformation, according to the principles described herein FIGS. 9B-9C show examples of buffer structure having an irregular structure, according to the principles described herein.

DETAILED DESCRIPTION

Figures 1A, 1B:
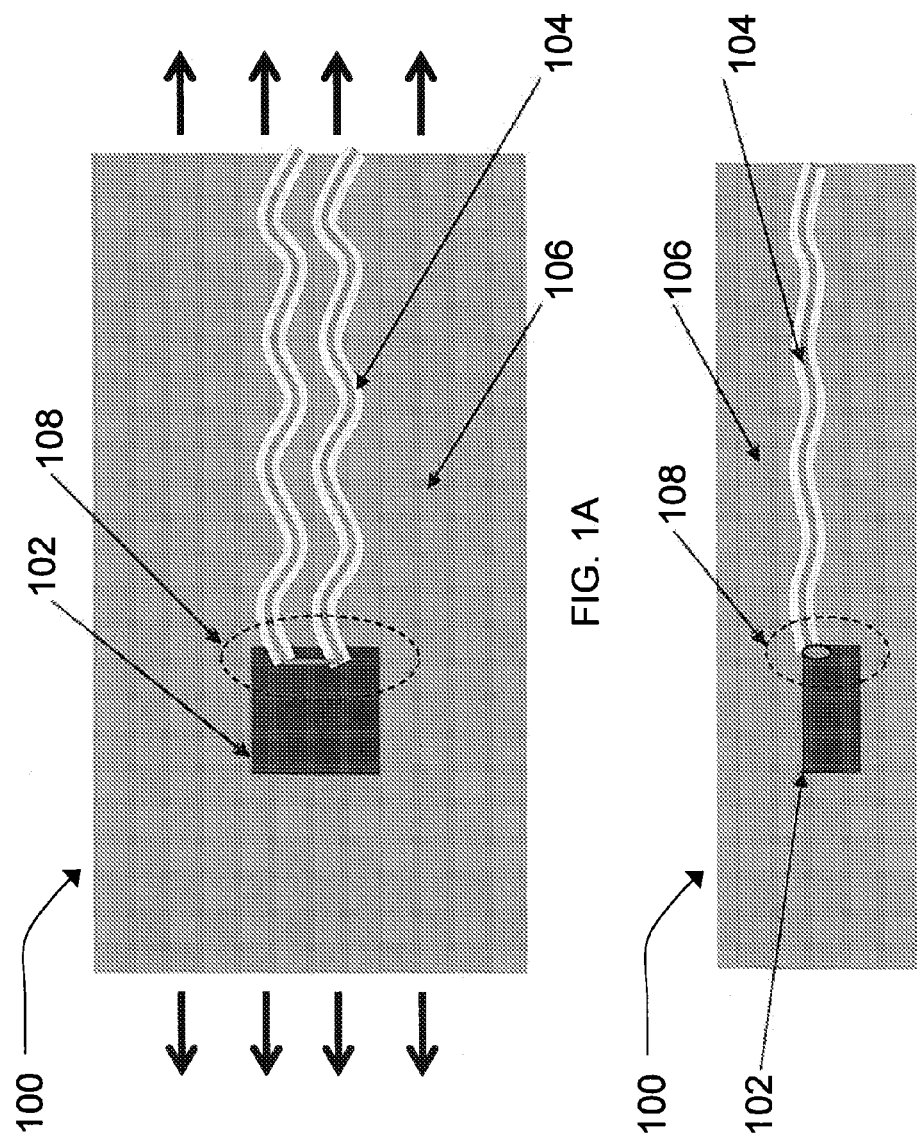
FIGS. 1A and 1B show top and cross-sectional side views of an example conformable electronic system, according to the principles described herein.

Following below are more detailed descriptions of various concepts related to, and embodiments of, an apparatus and systems for embedding thinned chips in a flexible polymer. It should be appreciated that various concepts introduced above and described in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on. As used herein, the term "disposed on" or "disposed above" is defined to encompass "at least partially embedded in."

With respect to substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate (or other surface) and each other. The terms "disposed on" "disposed in" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

A system, apparatus and method described herein provides strain isolation in a conformable electronic system. In order to create effective, compact, and durable systems, buffer structures are described herein that can be used to reduce a strain that can be exerted near a junction region between a stretchable and/or flexible interconnect or flexible interconnect and a device island when the conformable electronic system is subjected to stretching or torsion. The buffer structures according to the principles described herein are comprised of a material having elastic properties that can effectively redistribute the strain acting on the junction region between stretchable and/or flexible interconnects and rigid device islands in a device structure. For example, the stain isolation structure can be used to create a gradient in local rigidity that effectively redistributes the strain away from the junction region between the stretchable and/or flexible interconnects and the rigid device islands.

In an example system, apparatus and method according to the principles described herein, the buffer structures can be used to facilitate reduction in the concentration of the stress or strain at the junction region, i.e., the transition region from a more rigid component (such as but not limited to a device island) to a more compliant component (such as but not limited to a stretchable and/or flexible interconnect).

In an example system, apparatus and method according to the principles described herein, the buffer structure can have a curved conformation that minimize the stress or strain concentration at or near the sharp edge of integrated circuit (IC) chips. For example, the strain relief structure can be formed in a disk conformation, a torus conformation, or other closed curve conformation.

The example buffer structures can be disposed above and/or below the junction region between a more rigid component (such as but not limited to a device island) to a more compliant component (such as but not limited to a stretchable and/or flexible interconnect). The dimensions of the buffer structures are configured such that at least a portion of the buffer structures overlaps the device component and at least a portion of the buffer structure overlaps the junction region between the device component and the compliant component.

In an example, the device component can be disposed on or in a flexible base, the flexible base being formed of a material having elastic properties. In this example, at least a portion of the buffer structures overlaps the device component and at least a portion of the buffer structure overlaps the junction region between the device component and the compliant component.

An example system, apparatus and method according to the principles described herein can provide a platform of complex device integration and can be applied to many different kinds of stretchable electronic devices.

An example system, apparatus and method described herein includes at least. one strain relief structure that is independent of chip geometry, compatible with conventional semiconductor processes, and provides ease of fabrication.

FIGS. 1A and 1B show top and cross-sectional side views of a conformable electronic system 100 to which the example system, apparatus and method described herein can be applied. Example conformable electronic system 100 includes device components 102 and compliant components 104 encapsulated in an encapsulant 106. The compliant components 104 are in electrical communication with the device components 102 at a junction region 108. In an example, the compliant component 104 can be a stretchable and/or flexible interconnect. The encapsulant 106 can be any material having elastic properties, including a polymer or other polymeric material. In use, the example conformable electronic system 100 can be subjected to stretching, torsion or other forces. As shown in FIG. 1A, the forces can act to cause a stretching or elongation of the system along a longitudinal direction (e.g., along. the lines of forces shown in the figure). The applied forces can cause an amount of stress or strain to be exerted at junction region 108. The stress or strain at junction region 108 can cause an amount of structural damage at junction region 108, including crack formation in, or rupture of, the compliant component 104 or the junction region 108.

FIGS. 2A and 2B show top and cross-sectional side views of a conformable electronic system 150 that includes device components 102 and compliant components 104 encapsulated in encapsulant 106. The compliant components 104 are in electrical communication with the device components 102 at junction region 108. The device component 102 is disposed in, or at least partially embedded in, a flexible base 110. The compliant component 104 can be a stretchable and/or flexible interconnect. The encapsulant 106 can be any material having elastic properties, including a polymer or other polymeric material. In use, the example conformable electronic system 100 can be subjected to stretching, torsion or other forces. The flexible base 110 is to cushion the device component 102. As described in greater detail in connection with FIGS. 3A, 3B and 4, the stretching or elongation forces can cause an amount of stress or strain near the junction region.

Figure 3A:
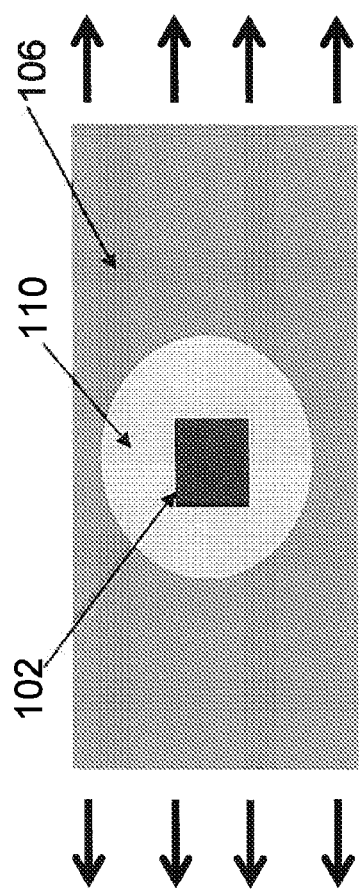
FIG. 3A shows an example apparatus that includes a strain isolation structure, according to the principles described herein.
Figure 3B:
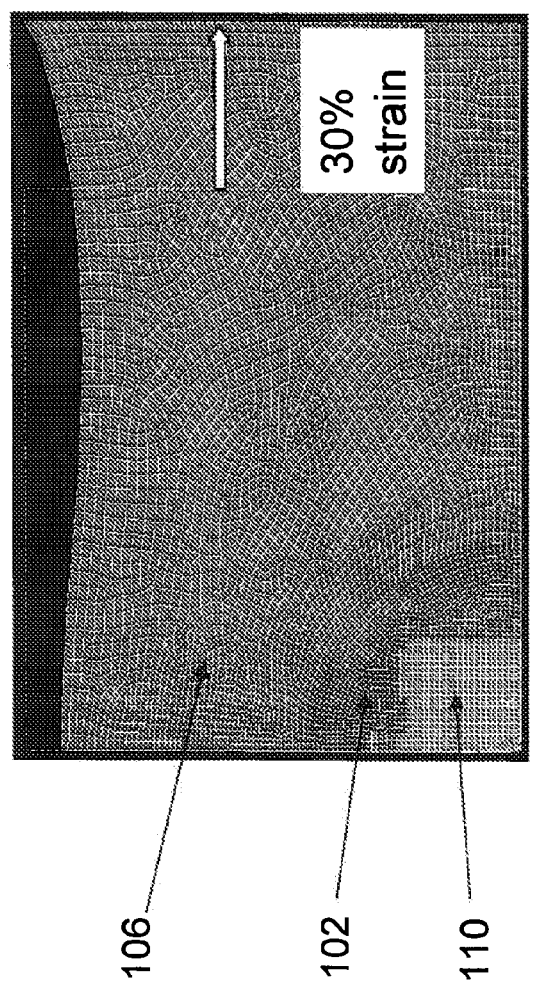
FIG. 3B shows example results of a finite element analysis of the example apparatus of FIG. 3A, according to the principles described herein.
Figure 4:
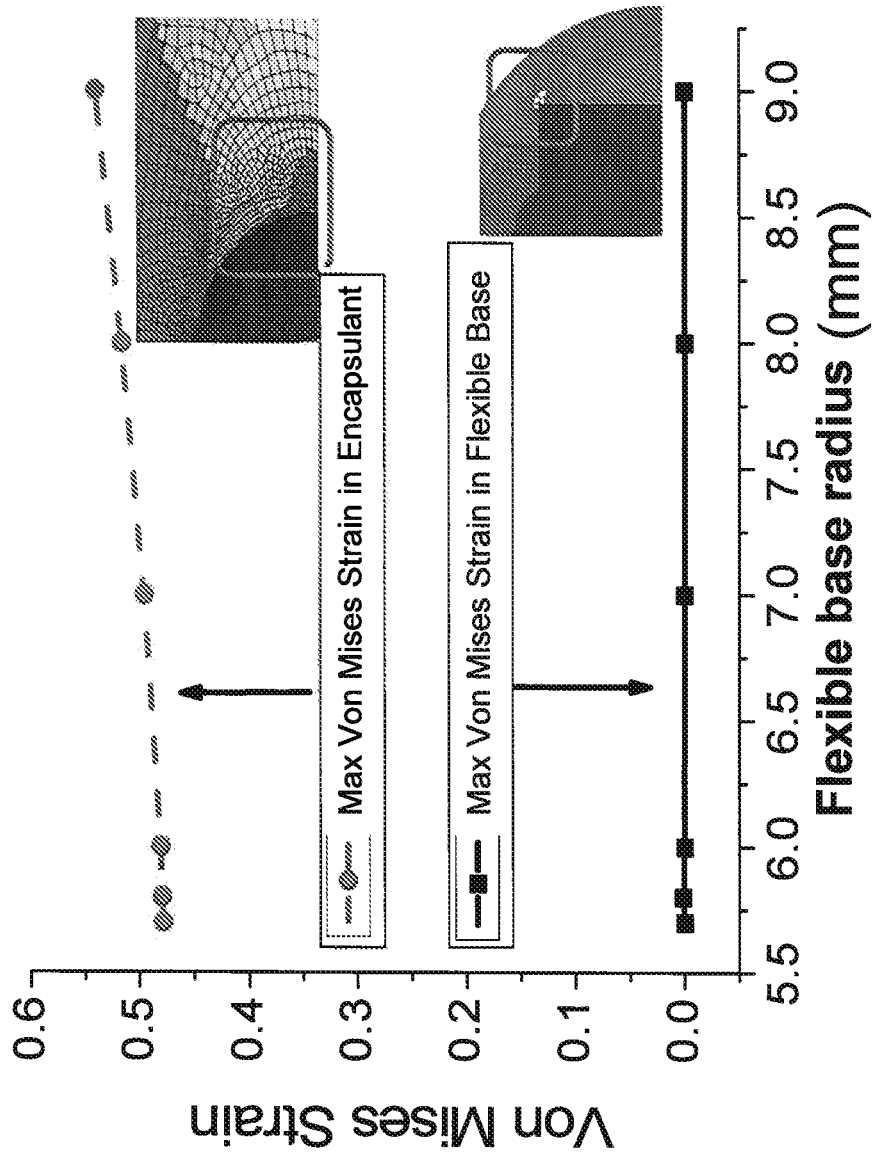
FIG. 4 shows a plot of an example distribution of strain in an example apparatus, according to the principles described herein.

FIG. 3A show a top views of an example structure that includes device component 102 disposed in a flexible base 110, encapsulated in an encapsulant 106. FIG. 3B shows results of a finite element analysis of the example structure as it is subjected to a stretching or other elongation force. Table 1 shows the materials properties of the components of this example structure of FIG. 3A, including silicon, which can be a constituent of the device component 110, a polyimide, which can be used to form the flexible base 102, and a silicone, which can be used as the encapsulant 106. FIG. 4 shows a plot of the distribution of strain (computed as Von Mises strain) in the encapsulant and in the flexible base in regions proximate the junction region between the device component and the compliant component.

TABLE 1

Table 1

|  | Young's modulus (MPa) | Poisson ratio |
|---|---|---|
| Silicon | $1.85 \times 10^5$ | 0.3 |
| Polyimide | $3.2 \times 10^3$ | 0.3 |
| Silicone | 0.06 | 0.485 |

FIGS. 5A and 5B show top and cross-sectional side views of an example apparatus 500 that includes a buffer structure to provide strain isolation. The example apparatus 500 includes a device component 502 and a compliant component 504, encapsulated in encapsulant 506. The compliant component 504 is in electrical communication with the device component 502 at junction region 508. The compliant component 504 can be a stretchable and/or flexible interconnect. The example apparatus of FIGS. 5A and 5B includes a buffer structure 509 disposed proximate to the junction region 508 and also encapsulated in the encapsulant 506. As shown in FIG. 5B, the buffer structure 509 overlaps with at least a portion of the junction region 508. The buffer structure 509 is comprised of material that has less elastic flexibility than the material of the encapsulant 506. As a non-limiting example, the buffer structure 509 has a higher value of Young's modulus than the encapsulant 506. While the example of FIGS. 5A and 5B illustrates the buffer structure 509 disposed in the example apparatus 500 proximate to and substantially below the junction region 508, it is also contemplated that the buffer structure 509 can be disposed in the example apparatus 500 proximate to and substantially above the junction region 508.

In any example system, apparatus and method described herein, the buffer structure can be either disposed on the surface of the flexible base (including an elastomer substrate), including being at least partially embedded in the flexible base (including an elastomer substrate).

FIGS. 6A and 6B show top and cross-sectional side views of another example apparatus 550 that includes a buffer structure to provide strain isolation. The example apparatus 550 includes the device component 502 and the compliant component 504, encapsulated in the encapsulant 506. The compliant component 504 is in electrical communication with the device component 502 at junction region 508. The compliant component 504 can be a stretchable and/or flexible interconnect. The example apparatus of FIGS. 5A and 5B includes a buffer structure 511 disposed proximate to the junction region 508 and also encapsulated in the encapsulant 506. Rather than the solid buffer structure 509 shown for the example of FIGS. 5A and 5B, the buffer structure 511 of FIGS. 6A and 6B is formed with a substantially hollow portion. As shown in FIG. 5B, the buffer structure 511 overlaps with at least a portion of the junction region 508. The buffer structure 509 is comprised of material that has less elastic flexibility than the material of the encapsulant 506. As a non-limiting example, the buffer structure 509 has a higher value of Young's modulus than the encapsulant 506.

In an example, the inner dimension of the hollow portion of the buffer structure 511 can be positioned to overlap with a portion of the device component proximate the junction region 508, and the outer dimension of the buffer structure 511 can be positioned to overlap with the junction region 508.

In an example, the buffer structure 511 can be formed as an annular structure. In this example, the inner diameter of the annular buffer structure can be positioned to overlap with a portion of the flexible base, and wherein the outer diameter of the annular buffer structure is positioned to overlap with the junction region.

FIG. 7A shows a cross-sectional side view of another example apparatus 700 that includes a buffer structure to provide strain isolation. The example apparatus 700 includes a device component 702 and a compliant component 704, encapsulated in encapsulant 706. The compliant component 704 is in electrical communication with the device component 702 at junction region 708. The compliant component 704 can be a stretchable and/or flexible interconnect. The device component 702 is disposed on, or at least partially embedded in, a flexible base 710. The example apparatus of FIG. 7A includes a buffer structure 711 that overlaps with at least a portion of the flexible base 710 and is also encapsulated by the encapsulant 706. The encapsulant 706 can be any material having elastic properties, including a polymer or other polymeric material. The flexible base 710 is formed from a material that has a higher value of Young's modulus than the material of the encapsulant. The buffer structure 711 is formed from a material that has a higher value of Young's modulus than the material of the encapsulant.

FIG. 7B shows a cross-sectional side view of another example apparatus 750 that includes two buffer structures to provide strain isolation. The example of FIG. 7B includes the same type of materials and components described above in connection with FIG. 7A. The description above in connection with the example apparatus 700 of FIG. 7A applies to the example apparatus 750 of FIG. 7B. The example apparatus 750 of FIG. 7B includes two buffer structures 711-*a* and 711-*b* that are disposed substantially opposite to each other, on either side of the device component 702 and flexible base 710. In the example of FIG. 7B, a central point of buffer structure 711-*a* approximately coincides with a central point of buffer structure 711-*b*. In other examples, the two buffer structures 711-*a* and 711-*b* can be displaced relative to each other in the encapsulant 706 such that a central point of buffer structure 711-*a* does not coincide with a central point of buffer structure 711-*b*, with buffer structure 711-*a* and/or buffer structure 711-*b* overlapping with at least a portion of the flexible base 710.

In the example apparatus of FIGS. 7A and 7B, the buffer structure 711, or buffer structures 711-*a* and 711-*b*, can be formed as annular buffer structures. In these example, the inner diameter of the annular buffer structure can be positioned to overlap a portion of the flexible base 710. In another example, the outer diameter of the annular buffer structure can be positioned over a portion of the junction region 708.

FIG. 8A shows a cross-sectional side view of another example apparatus 800 that includes a buffer structure to provide strain isolation. The example apparatus 800 includes a device component 802 and a compliant component 804, encapsulated in an encapsulant 806 that is formed from any material having elastic properties, including a polymer or other polymeric material. The compliant component 804 is in electrical communication with the device component 802 at junction region 808. The compliant component 804 can be a stretchable and/or flexible interconnect. The device component 802 is disposed on, or at least partially embedded in, a flexible base 810. In the example apparatus of FIG. 8A, the buffer structure 811 is formed as a substantially solid structure that overlaps with at least a portion of the flexible base 810 and is also encapsulated by the encapsulant 806. The flexible base 810 is formed from a material that has a higher value of Young's modulus than the material of the encapsulant. The buffer structure 811 is formed from a material that has a higher value of Young's modulus than the material of the encapsulant 806.

FIG. 8B shows a cross-sectional side view of another example apparatus 850 that includes two of the buffer structures 811-*a* and 811-*b*. The example of FIG. 8B includes the same type of materials and components described above in connection with FIG. 8A. The description above in connection with the example apparatus 800 of FIG. 8A applies to the example apparatus 850 of FIG. 8B. The two buffer structures 811-*a* and 811-*b* are disposed substantially opposite to each other, on either side of the device component 802 and flexible base 810, in the example of FIG. 8B. In other examples, the two buffer structures 811-*a* and 811-*b* can be displaced relative to each other in the encapsulant 806, with buffer structure 811-*a* and/or buffer structure 811-*b* overlapping with at least a portion of the flexible base 810.

In any example apparatus according to the principles described herein, the buffer structure, including any one or more of buffer structures 511, 711, 711-*a*, 711-*b*, 811, 811-*a*, and 811-*b*, can be formed to have a substantially cylindrical conformation or to have a substantially polygonal prism conformation. FIG. 9A shows an example of buffer structures that have a substantially polygonal prism conformation, as either a solid buffer structure 900 or as a buffer structure 910 that includes a hollow portion 920. While the example of FIG. 9A is shown as having hexagonal symmetry, the buffer structure, including any one or more of buffer structures 511, 711, 711-*a*, 711-*b*, 811, 811-*a*, and 811-*b*, can be formed to have hexagonal or any other polygonal symmetry or an irregular structure.

In any example apparatus according to the principles described herein, the buffer structure, including any one or more of buffer structures 511, 711, 711-*a*, 711-*b*, 811, 811-*a*, and 811-*b*, can be formed to have an irregular structure. As shown in FIGS. 9B and 9C, the buffer structure having an irregular structure can include at least one protruding portion that overlaps a portion of the flexible substrate, the junction region, and/or a portion of the compliant according to the principles of any of the examples herein is contemplated.

FIG. 9B shows a top view of another example apparatus that includes a buffer structure to provide strain isolation. The example apparatus includes a device component 952 and a compliant component 954, encapsulated in an encapsulant 956 that is formed from any material having elastic properties, including a polymer or other polymeric material. The compliant component 954 is in electrical communication with the device component 802 at junction region 958. The compliant component 954 can be a stretchable and/or flexible interconnect. The device component 952 is disposed on, or at least partially embedded in, a flexible base 960. In the example apparatus of FIG. 9B, the buffer structure 961 is also encapsulated by the encapsulant 956 and is formed as an irregular structure including a protruding portion 961-*a*. The buffer structure 961 can be disposed in the example apparatus such that the protruding portion 961-*a* overlaps with at least a portion of the device component 952, with the junction region 958 and/or with flexible base 960. As shown in FIG. 9B, the buffer structure 961 also can be disposed such that the protruding portion 961-*a* overlaps with at least a portion of the compliant component 954. The flexible base 960 is formed from a material that has a higher value of Young's modulus than the material of the encapsulant 956. The buffer structure 961, including protruding portion 961-*a*, is formed from a material that has a higher value of Young's modulus than the material of the encapsulant 956.

FIG. 9C shows a top view of another example apparatus that includes a buffer structure to provide strain isolation. The example apparatus includes a device component 982 and a compliant component 984, encapsulated in an encapsulant 986 that is formed from any material having elastic properties, including a polymer or other polymeric material. The compliant component 984 is in electrical communication with the device component 802 at junction region 988. The compliant component 984 can be a stretchable and/or flexible interconnect. The device component 982 is disposed on, or at least partially embedded in, a flexible base 990. In the example apparatus of FIG. 9B, the buffer structure 991 is also encapsulated by the encapsulant 986 and is formed as an irregular structure including two protruding portions 991-*a* and 991-*b*. The buffer structure 991 can be disposed in the example apparatus such that the protruding portions 991-*a* and 991-*b* overlap with at least a portion of the device component 982, with the junction region 988 and/or with flexible base 990. As shown in FIG. 9B, the buffer structure 991 also can be disposed such that the protruding portion 991-*a* and 991-*b* overlap with, and can be disposed along the sides of, at least a portion of the compliant component 984. The flexible base 990 is formed from a material that has a higher value of Young's modulus than the material of the encapsulant 986. The buffer structure 991, including protruding portions 991-*a* and 991-*b*, is formed from a material that has a higher value of Young's modulus than the material of the encapsulant 986.

Any example apparatus described herein can be formed as a multi-layer apparatus that includes multi-layer arrangement of the device components and the compliant components. In this example, the multi-layer apparatus can include at least one buffer structure that is positioned relative to the junction region between at least one device component and at least one compliant structure according to the principles of any of the examples described herein. Where the multi-layer apparatus includes a device component disposed on or at least partially embedded in a flexible base, the multi-layer apparatus can include at least one buffer structure that is positioned relative to the junction region between at least one device component and at least one compliant structure according to the principles of any of the examples described herein. In various examples, the multi-layer apparatus can include two, three, four or more buffer structures, each of which is positioned in an example multi-layer apparatus relative to a device component, a junction region, a flexible substrate, a stretchable, and/or a flexible interconnect according to the principles of any of the examples described herein. In any of the examples that include two or more buffer structures, at least two of the buffer structures can be disposed relative to each other such that a central point of the first buffer structure approximately coincides with a central point of the second buffer structure, or at least two of the buffer structures can be disposed relative to each other such that a central point of the first buffer structure is displaced relative to a central point of the second buffer structure.

Figure 10:
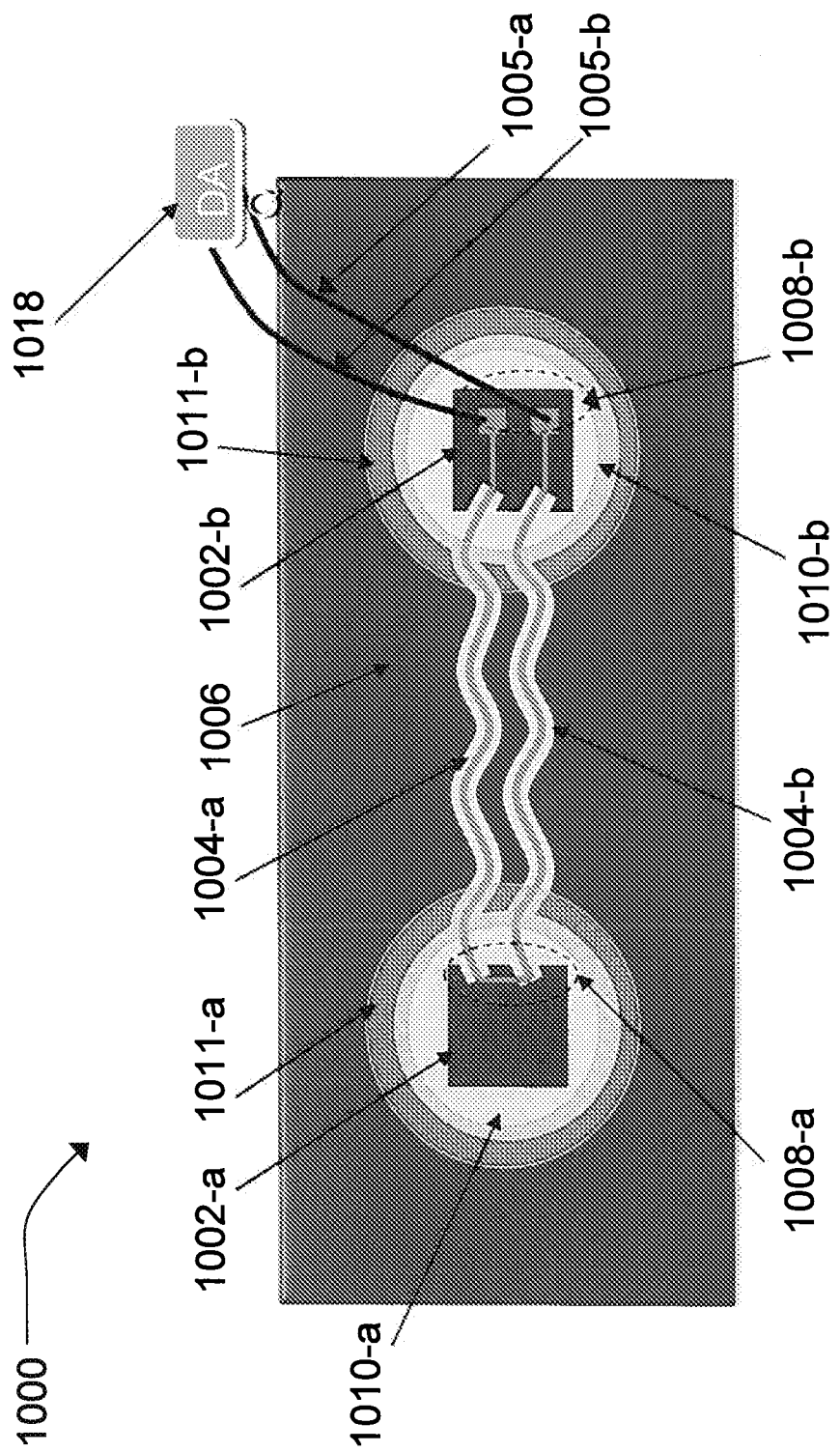
FIG. 10 shows a top view of another example apparatus, according to the principles described herein.

In another example, the buffer structures described herein can be disposed in an example apparatus that includes multiple interconnections between device components. FIG. 10 shows a top view of an example apparatus 1000 that includes two buffer structures. The example apparatus 1000 includes two device components (devise component 1002-*a* and device component 1002-*b*). The example apparatus 1000 includes compliant components 1004-*a* and 1004-*b* and compliant components 1005-*a* and 1005-*b*, each formed as stretchable and/or flexible interconnect. As shown in FIG. 10, some of the compliant components (such as compliant components 1004-*a* and 1004-*b*) can provide electrical communication between device components at a junction region (such as junction region 1008-*a*). Other compliant components (such as compliant components 1005-*a* and 1005-*b*) can provide electrical communication at a junction region (such as junction region 1008-*b*) between device components and an external device, such as device 1018. As also shown in FIG. 10, at least one of the devise components (devise component 1002-*a* and/or device component 1002-*b*) can be disposed on, or at least partially embedded in, a flexible base (such as flexible base 1010-*a* or flexible base 1010-*b*). The example apparatus 1000 can be encapsulated in an encapsulant 1006 that is formed from any material having elastic properties, including a polymer or other polymeric material. The example apparatus of FIG. 10 also includes buffer structures 1011-*a* and 1011-*b*, each of which is also encapsulated by the encapsulant 1006. The buffer structures 1011-*a* and 1011-*b* can be disposed in the example apparatus 1000 such that it overlaps with at least a portion of a device component (devise component 1002-*a* and device component 1002-*b*), with a junction region (junction region 1008-*a* or junction region 1008-*b*), with at least a portion of a flexible base (flexible base 1010-*a* or flexible base 1010-*b*), and/or with at least a portion of a compliant component (compliant components 1004-*a*, 1004-*b*, 1005-*a*, or 1005-*b*). The flexible base 1010-*a* or 1010-*b* can be formed from a material that has a higher value of Young's modulus than the material of the encapsulant 1006. The buffer structure 1011-*a* or 1011-*b* can be formed from a material that has a higher value of Young's modulus than the material of the encapsulant 1006.

In any of the example apparatus according to the principles described herein, the stretchable and/or flexible interconnects can be formed from a conductive material. In any of the examples described herein, the conductive material can be but is not limited to a metal, a metal alloy, a conductive polymer, or other conductive material. In an example, the metal or metal alloy of the coating may include but is not limited to aluminum, stainless steel, or a transition metal (including copper, silver, gold, platinum, zinc, nickel, titanium, chromium, or palladium, or any combination thereof) and any applicable metal alloy, including alloys with carbon. In other non-limiting example, suitable conductive materials may include a semiconductor-based conductive material, including a silicon-based conductive material, indium tin oxide or other transparent conductive oxide, or Group III-IV conductor (including GaAs). The semiconductor-based conductive material can be doped.

In any of the example apparatus according to the principles described herein, the intersection structure, the flexible base, and/or the encapsulant can be formed from any material having elastic properties, subject to the described relationship of elastic properties required for each apparatus. For example, intersection structure, the flexible base, and/or the encapsulant can be formed from a polymer or polymeric material. Non-limiting examples of applicable polymers or polymeric materials include, but are not limited to, a polyimide, a polyethylene terephthalate (PET), a silicone, or a polyeurethane. Other non-limiting examples of applicable polymers or polymeric materials include plastics, elastomers, thermoplastic elastomers, elastoplastics, thermostats, thermoplastics, acrylates, acetal polymers, biodegradable polymers, cellulosic polymers, fluoropolymers, nylons, polyacrylonitrile polymers, polyamide-imide polymers, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins, or any combinations of these materials. In an example, a polymer or polymeric material herein can be a UV curable polymer, or a silicone such as but not limited to ECOFLEX® (BASF, Florham Park, N.J.).

In various examples, the flexible base and the buffer structure can be formed from the same polymer or polymeric material, or from different polymers or polymeric materials. In an example, the encapsulant can be a silicone such as but not limited to ECOFLEX® (BASF, Florham Park, N.J.).

For applications in biomedical devices, the encapsulant should be biocompatible. The stretchable and/or flexible interconnects can be embedded in a polyimide that also acts as a mechanical reinforcement.

In any of the example structures described herein, the stretchable and/or flexible interconnects can have a thickness of about 0.1 μm, about 0.3 μm, about 0.5 μm, about 0.8 μm, about 1 μm, about 1.5 μm, about 2 μm or greater. The buffer structure and/or flexible base can have a thickness of about 5 μm, about 7.5 μm, about 9 μm, about 12 μm or greater. In any example herein, the encapsulant can have a thickness of about 100 μm, about 125 μm, about 150 μm, about 175 μm, about 200 μm, about 225 μm, about 250 μm, about 300 μm or greater.

Figure 11A:
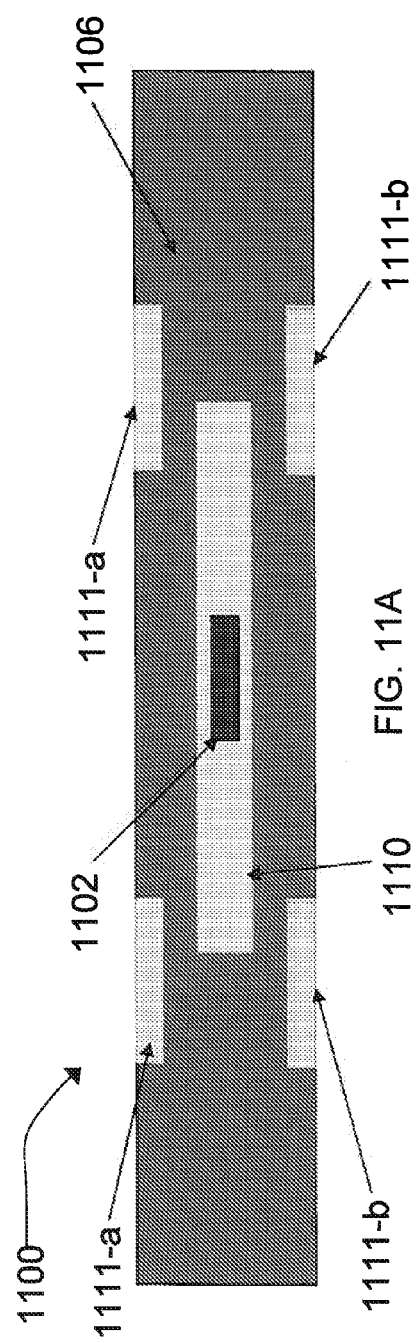
FIG. 11A shows a cross-sectional side view of another example apparatus, according to the principles described herein.

FIG. 11A shows a cross-sectional side view of an example apparatus 1100 that includes two buffer structures, which is used as a model to perform a finite element analysis (described in connection with FIG. 11B). The example of FIG. 11A includes a device component 1102 disposed or at least partially embedded in a flexible base 1110, buffer structures 1111-*a* and 1111-*b* that are disposed substantially opposite to each other, on either side of the device component 1102 and flexible base 1110, all encapsulated in encapsulant 1106. The example of FIG. 11A includes the same type of materials and components described above in connection with equivalent components of any of the previous example apparatus.

Figure 11B:
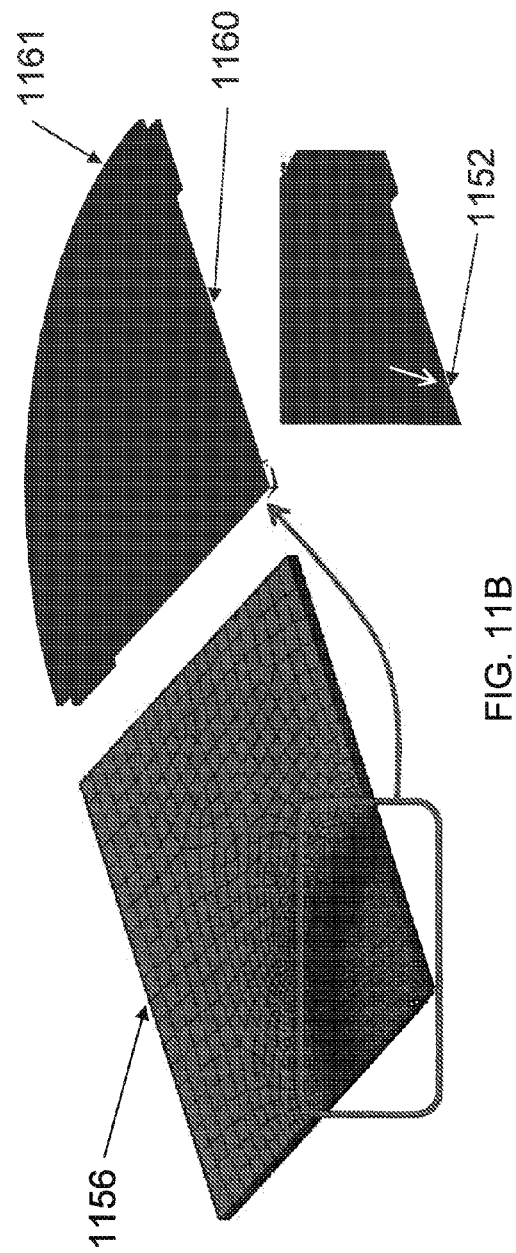
FIG. 11B shows the finite element model approximation for the components in an example computation of an example apparatus, according to the principles described herein.

FIG. 11B shows the finite element model approximation for the encapsulant 1156, the flexible base 1160, the buffer structure 1161, and the device component 1152. In this example, the flexible base and the buffer structures are approximated as being comprised of a polyimide. The encapsulant is approximated as being comprised of a silicone. The device component is approximated as being comprised of a silicon-based device.

Figure 12A:
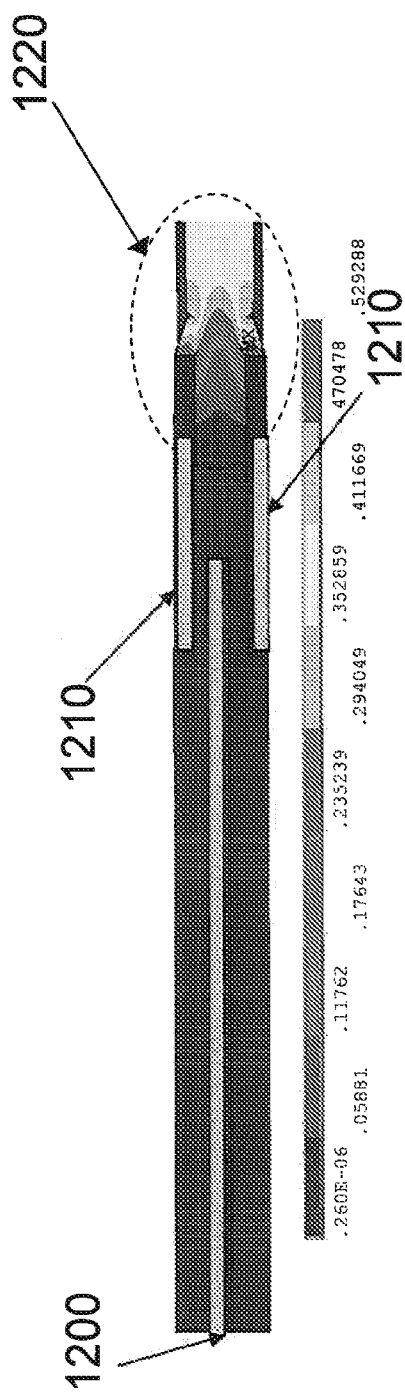
FIGS. 12A and 12B show example results of the finite element computations of FIG. 11B, according to the principles described herein.
Figure 12B:
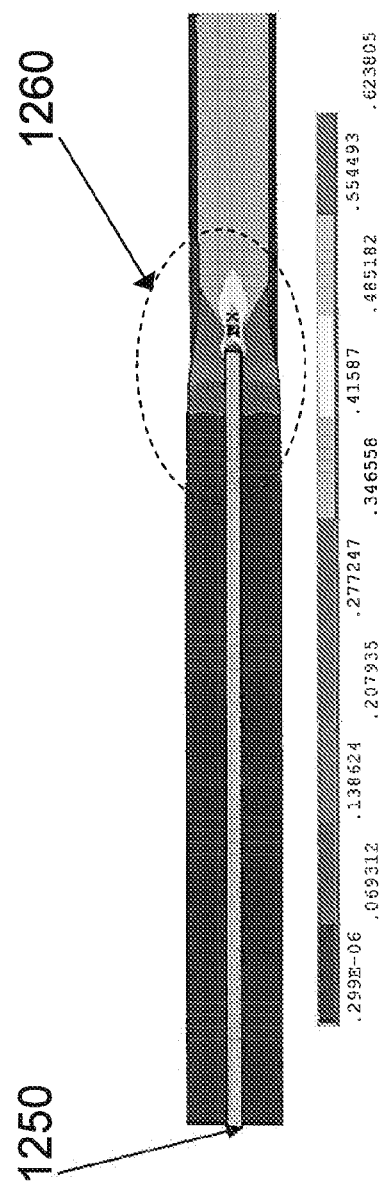

FIGS. 12A and 12B show example results of the finite element computations. FIG. 12A show example results of the finite element computations of the example apparatus 1100 of FIG. 11A being subjected to a stretching or elongation force. FIG. 12B show example results of the finite element computations of an example apparatus similar to FIG. 11A which does not include buffer structures 1111-*a* and 1111-*b*, also being subjected to the stretching or elongation force. FIG. 12B shows that, in the absence of buffer structures, the area 1260 of higher strain concentration in the encapsulant coincides with the edge of the device component 1250, even though the device component 1250 is disposed in a flexible base. A junction region of an electrical communication between a device component and a compliant structure could be disposed proximate to this edge. Such a concentration of strain as shown in FIG. 12B could cause damage to the junction region during a stretching or elongation, including possibly resulting in rupture of the junction region. In addition, such a concentration of strain at the edge can cause interfacial delamination between the device component and the flexible base near the edge. By comparison, FIG. 12A shows that the buffer structures 1210 cause the area 1220 of higher strain concentration in the encapsulant to shift from the edge of the device component 1200 or the flexible base, to instead be concentrated in an outer area. As a result, a strain that might develop at the junction region of an apparatus is channeled away from that area. Such a distribution of strain as shown in FIG. 12B could reduce the risk of or prevent damage to the junction region during a stretching or elongation, thereby maintaining the performance of the apparatus. In addition, there is less risk of interfacial delamination between the device component and the flexible base near the edge. In an example, the buffer structure in FIG. 12A can be extended to the edge of the high strain concentration region.

Figure 13:
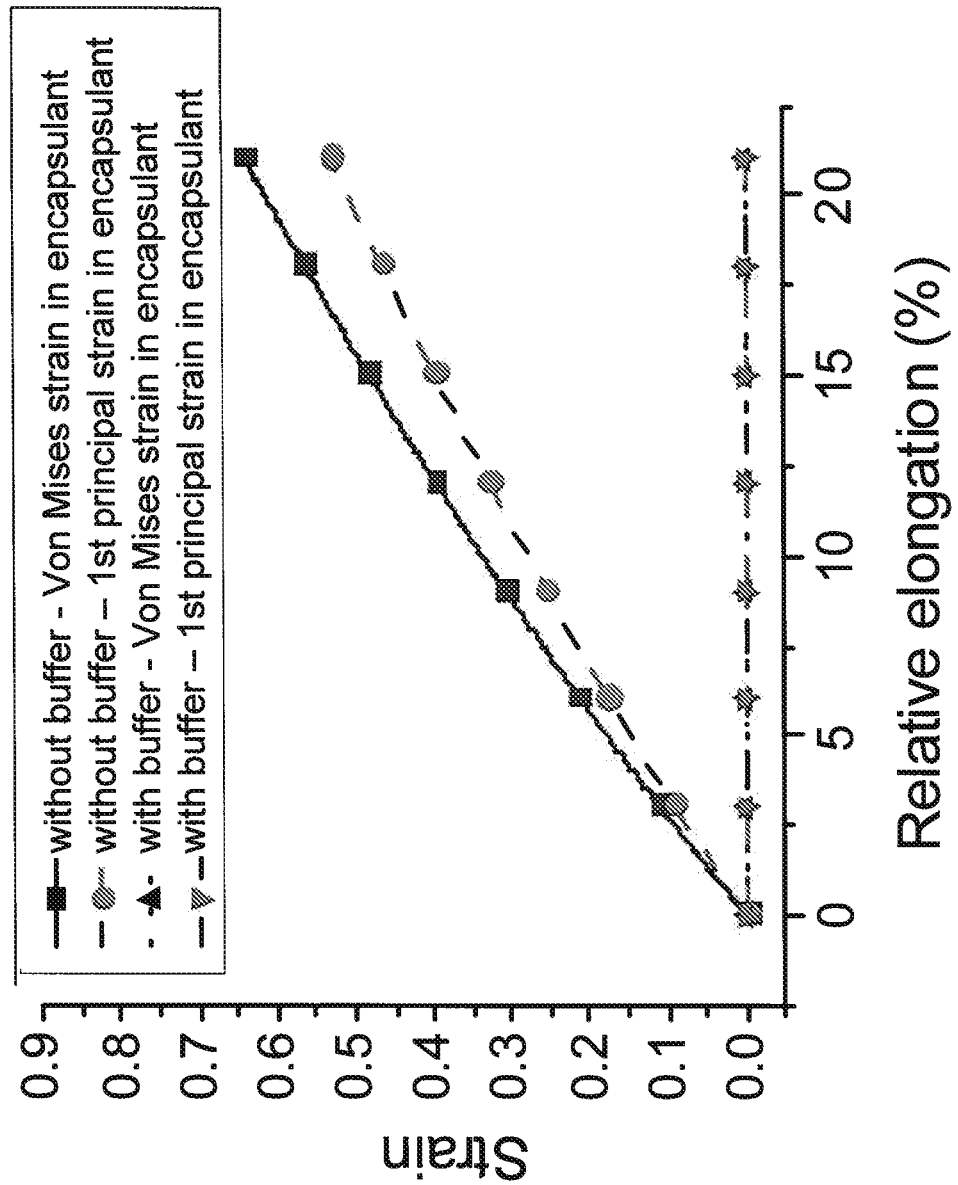
FIG. 13 shows a plot of the von Mises strain and first principal strain versus relative elongation for the example computation of FIGS. 12A and 12B, according to the principles described herein.

FIG. 13 shows a plot of the von Mises strain and first principal strain versus relative elongation for the computation of FIGS. 12A and 12B. In particular, FIG. 13 shows that the values of von Mises strain and first principal strain in the apparatus without a buffer are higher than for the apparatus that includes a buffer structure.

The example apparatus described herein can be fabricated using any technique in the art. For example, the conductive materials of the stretchable and/or flexible interconnects can be fabricated using evaporation, sputtering, or other deposition technique, and then patterned according to the desired conformation. The flexible base, the buffer structure, and/or the encapsulant can be formed using, e.g., spin-coating or casting and using a mask or a mold to define the desired shape of the component.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be examples and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention may be implemented in any of numerous ways. For example, some embodiments may be implemented using hardware, software or a combination thereof. When any aspect of an embodiment is implemented at least in part in software, the software code may be executed on any suitable processor or collection of processors, whether provided in a single device or computer or distributed among multiple devices/computers.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification, unless clearly indicated to the contrary, should be understood to mean "at least one."

The phrase "and/or," as used herein in the specification, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

What is claimed is:

1. An apparatus comprising:
   a silicon-based semiconductor device component;
   a flexible base, the silicon-based semiconductor device component being disposed on, or at least partially embedded in, the flexible base;

at least one conductive stretchable interconnect in electrical communication with the silicon-based semiconductor device component, the at least one conductive stretchable interconnect forming the electrical communication with the silicon-based semiconductor device component at a junction region;

a buffer structure having an annular shape with an inner edge surface defining an inner diameter of the annular shape and an outer edge surface defining an outer diameter of the annular shape, the inner edge surface of the buffer structure being horizontally offset from the junction region in a first direction and the outer edge surface of the buffer structure being horizontally offset from the junction region in a second opposing direction; and an encapsulant encapsulating at least the silicon-based semiconductor device component and the junction region, wherein:

the buffer structure overlaps with at least a portion of the flexible base;

the flexible base has a higher value of Young's modulus than the encapsulant; and the buffer structure has a higher value of Young's modulus than the encapsulant.

2. The apparatus of claim 1, wherein the buffer structure includes a polymer.

3. The apparatus of claim 2, wherein the polymer includes a polyimide.

4. The apparatus of claim 1, wherein the at least one conductive stretchable interconnect comprises gold, copper, aluminum, stainless steel, silver, a doped semiconductor, a conductive polymer, or any combination thereof.

5. The apparatus of claim 1, wherein the buffer structure is sized, shaped, and positioned to redistribute strain imparted on the apparatus away from the junction region.

6. The apparatus of claim 1, wherein the buffer structure is more rigid than the encapsulant.

7. The apparatus of claim 1, wherein the buffer structure is thicker than the at least one conductive stretchable interconnect.

8. The apparatus of claim 1, wherein the at least one conductive stretchable interconnect is positioned in a first layer of the apparatus and wherein the buffer structure is positioned in a second layer of the apparatus that is spaced from the first layer of the apparatus.

9. The apparatus of claim 8, wherein the first layer is in a first X-Y plane and the second layer is in a second X-Y plane, the first and second X-Y planes being spaced from each other along a Z-axis that is perpendicular to both of the first and second X-Y planes.

10. The apparatus of claim 1, wherein the buffer structure is formed from a non-conductive material.

11. The apparatus of claim 1, wherein the encapsulant includes an elastomer.

12. The apparatus of claim 1, wherein the encapsulant includes a silicone polymer.

13. The apparatus of claim 1, wherein the encapsulant includes polyethylene terephthalate (PET).

14. The apparatus of claim 1, wherein the encapsulant includes polyurethane.

15. The apparatus of claim 1, wherein the encapsulant is biocompatible.

16. The apparatus of claim 1, wherein the encapsulant has a thickness of about 100 micrometers, about 125 micrometers, about 150 micrometers, about 175 micrometers, about 200 micrometers, about 225 micrometers, about 250 micrometers, about 300 micrometers, or greater.

17. The apparatus of claim 1, wherein the flexible base includes a polymeric material.

18. The apparatus of claim 1, wherein the flexible base includes a silicone polymer.

19. The apparatus of claim 1, wherein the flexible base is formed from a biodegradable material.

20. The apparatus of claim 1, wherein the flexible base has a thickness of about 5 micrometers, about 7.5 micrometers, about 9 micrometers, about 12 micrometers, or greater.

* * * * *